US008085171B2

(12) United States Patent
Paris

(10) Patent No.: US 8,085,171 B2
(45) Date of Patent: *Dec. 27, 2011

(54) HIGH-SPEED DATA COMPRESSION BASED ON SET ASSOCIATIVE CACHE MAPPING TECHNIQUES

(75) Inventor: Luis Paris, Harrisburg, PA (US)

(73) Assignee: University of Mississippi, University, MS (US)

( * ) Notice: Subject to any disclaimer, the term of this patent is extended or adjusted under 35 U.S.C. 154(b) by 617 days.

This patent is subject to a terminal disclaimer.

(21) Appl. No.: 12/250,970

(22) Filed: Oct. 14, 2008

(65) Prior Publication Data
US 2009/0077109 A1    Mar. 19, 2009

Related U.S. Application Data

(63) Continuation-in-part of application No. 11/691,185, filed on Mar. 26, 2007, now Pat. No. 7,436,330.

(60) Provisional application No. 60/785,572, filed on Mar. 24, 2006.

(51) Int. Cl.
*H03M 7/34* (2006.01)
*H03M 7/38* (2006.01)

(52) U.S. Cl. ........................................... 341/51; 341/50

(58) Field of Classification Search .................... 341/51, 341/50, 106; 711/169, 207, 117, 118; 714/70
See application file for complete search history.

(56) References Cited

U.S. PATENT DOCUMENTS

| | | | |
|---|---|---|---|
| 3,675,211 A | 7/1972 | Raviv | |
| 6,657,565 B2 | 12/2003 | Kampf | |
| 7,064,489 B2 | 6/2006 | Price | |
| 7,180,433 B1 | 2/2007 | Grotmol | |
| 7,224,293 B2 | 5/2007 | Parker | |
| 7,233,265 B2 | 6/2007 | Cockburn et al. | |
| 2007/0245097 A1 | 10/2007 | Gschwind et al. | |

OTHER PUBLICATIONS

Welch, T. A., A Technique for High-Performance Data Compression. IEEE Computer.17(6):8-19, Jun. 1984.
Salomon, D., Data Compression, $2^{nd}$ ed. Springer-Verlag, New York, NY, 2000.
Ziv, J., and Lempel, A., A Universal Algorithm for Sequential Data Compression. IEEE Transactions on Information Theory. IT-23(3):337-343, 1977.
Huffman, D., A Method for the Construction of Minimum Redundancy Codes, Proceedings of the IRE 40(9):1098-1101, 1952.

(Continued)

*Primary Examiner* — Peguy Jean Pierre
(74) *Attorney, Agent, or Firm* — Stites & Harbison PLLC; Stephen J. Weyer; Richard S. Myers, Jr.

(57) ABSTRACT

A method is provided for compressing data from a stream of values using one or many distinct memory addresses as workspace, each memory address containing one or many values. The method works by reading two contiguous data values, of length K and N bits, from the stream, as a memory address reference (MAR) and a symbol, respectively. If the symbol does not match any of the values in the memory address pointed to by MAR, the symbol replaces one of those values, and a MISS code, followed by the symbol, is appended to the compressed stream; otherwise, a HIT code is appended to the compressed stream, said code representing a function of the location where the matched value was found in the memory address. Advantageously, the workspace behaves analogous to a cache memory used in computer architecture, allowing hardware or software parallel implementations using content addressable memory or associative arrays.

30 Claims, 11 Drawing Sheets

OTHER PUBLICATIONS

Ott, E., Compact Encoding of Stationary Markov Sources, IEEE Trans. On Information Theory, vol. IT-1, No. 1, Jan. 1967, pp. 82-86.

Mommens, J. H., Raviv, J., Coding for Data Compation, IBM Research Report RC5150, T.J. Watson Research Center, Yorktown, NY, 1974.

Teuhola, J., Raita, T., Text Compression Using Prediction, Proc. of ACM Conf. on Information Retrieval (SIGIR), pp. 97-102, 1986.

Smith, A.J., Cache Memories, Computing Surveys, vol. 14, pp. 473-530, Sep. 1982.

Tanenbaum, A., Structured Computer Organization, 4th ed., Prentice Hall, New Jersey, 1999.

|  | Line 0 | Line 1 | ... | Line $2^L$-1 | S |
|---|---|---|---|---|---|
| Set 0: | Block[0,0] | Block[0,1] | ... | Block[0,$2^L$-1] | S[0] |
| Set 1: | Block[1,0] | Block[1,1] | ... | Block[1,$2^L$-1] | S[1] |
| ... | ... | ... | ... | ... | ... |
| Set ($2^K$-1): | Block[$2^K$-1,0] | Block[$2^K$-1,1] | ... | Block[$2^K$-1,$2^L$-1] | S[$2^K$-1] | where:
- K: Number of bits needed to address $2^K$ sets.
- L: Number of bits needed to address $2^L$ lines.
- S: Status bits (for replacement policy – LRU, LFU, etc.)

FIGURE 7 a) Unaligned compressed output data b) Aligned compressed output data

HIGH-SPEED DATA COMPRESSION BASED ON SET ASSOCIATIVE CACHE MAPPING TECHNIQUES

CROSS REFERENCE TO RELATED APPLICATIONS

This is a continuation-in-part of U.S. patent application Ser. No. 11/691,185, filed Mar. 26, 2007 and issued as U.S. Pat. No. 7,436,330, which, claims priority to U.S. provisional application No. 60/785,572, filed Mar. 24, 2006, both herein incorporated by reference.

BACKGROUND OF THE INVENTION

The progressive digitalization of information has given birth to a myriad of communication technologies, multimedia applications, new data formats, and novel storage devices that have flourished over the past two decades. Text, images, and video transmitted over the web, server based file access, document transfers, database inquiries, and geographic mapping technologies, are among the increasing number of data and multimedia applications that transform and communicate the digital information into a format that can be readily used. The amount of resources that are required to drive this plethora of multimedia capabilities in terms of storage, transmission, and computing power can be daunting.

One of the technological advances that has allowed the deployment of data intensive and multimedia applications is data compression. For instance the delivery of large files comprising scientific information, high quality images, and live video content over the web or a corporate network involves the use of some data compression. Likewise, the transmission of such equivalent services over cell phones and other wireless technologies can greatly benefit from data compression to efficiently use the available communication bandwidth.

Data compression is the art of removing redundancy in the information content of a message, a sequence of bits stored in a file, memory buffer, data stream, etc. Representing information in fewer bits results in saving more content space on storage media, and increases the effective bandwidth available for transmission by dispensing more data per time unit. Therefore, data compression has played, and will continue to play a key role in making both communications and multimedia affordable technologies for everyone.

In the act of data compression, two different processes are implicated when referring to a data compression method. The two methods are referred to as the compressor and the reconstructor. In the literature, the latter is more commonly referred to as the decompressor or expandor, although some purists use the term reconstructor to explicitly imply a reconstruction process on the compressed data. The term reconstruction is preferred and used throughout this disclosure to refer explicitly to a reconstruction process.

The compressor, as its name implies, processes the input source and converts it into another digital representation of the original that is ideally smaller in size. By contrast, the reconstructor processes the compressed data and creates a reconstructed version of the original. If the source and the reconstructed contents match exactly, the method is said to be lossless, otherwise it is considered lossy. Lossy schemes usually obtain higher compression ratios than lossless schemes at the expense of quality degradation.

Although many compression schemes have been developed and adapted over the years, most of them place a strong emphasis on improving compression gain only. However, one factor that typically is overlooked is the speed of the compression-reconstruction process. In time critical applications, such as multimedia streaming, video processing, or wireless transfer of data, the speed of compression-reconstruction (hereinafter referred to as "codec") can be as important, if not more important, than compression gain. Spending too much time on either compression or reconstruction is typically an unjustified commodity in most real time scenarios. It is the combination of channel bandwidth, codec gain and codec speeds which ultimately determine the response time and shape the performance of the application using the data. In short, if data is delivered faster, it will get processed and used sooner. As a result, time critical applications become possible or work more optimally if data is compressed faster.

SUMMARY OF THE INVENTION

The present invention relates to a method of data compression and its reverse equivalent, reconstruction method. The methods feature efficient, high speed, light-weight, real-time, and highly configurable, lossless data compression, and hence, are suitable for a wide range of applications with various communication requirements. One novel aspect of the present invention is the use of pseudo cache memory as workspace to produce and reconstruct the compressed data. The cornerstone of the technology is based on a new cache mapping compression (CMC) model which has the intrinsic ability to favor compression speed naturally, as well as the potential to be exploited in hardware due to the inherent parallelism of the compression process. Hence, speed-optimized hardware codec boxes are possible, capable of processing data streams significantly faster than most state-of-the-art compressors under similar bandwidth conditions. In essence, the visible features of this invention are:
  (a) Very low memory consumption,
  (b) Very low usage of system resources,
  (c) Very high execution speed for both compression and reconstruction methods,
  (d) Competitive compression ratios for most data formats,
  (e) Minimum delivery time, the effect of adding up compression time+transfer time+reconstruction time, at high bandwidths.

These characteristics make the method a target for embedded systems, PDAs, System-an-a-chip (SOC) designs and other hardware devices with limited system resources. Moreover, the simplicity of the CMC methods allows for inexpensive hardware or software implementations. Therefore, this invention has potentially high commercial value for the wireless, embedded, and electronics hardware and software industries.

As with most prior data compression methods, the present method reduces the size of a source data stream by eliminating redundant, repeated, or repetitively used data, produced by character runs and/or partial string matches, to generate a compressed data stream. The source data stream comprises a string or sequence of values, namely N bits, to be compressed. The compressed data stream comprises a subset of the original data stream, along with compression codes (MISS and HIT), which are inserted into the compressed data stream based on the present compression method, described below. Compression is achieved, in part, by a new and novel method that eliminates redundant, repeated values in the source data stream, and inserting compression codes, MISS or HIT, into the compressed data stream to guide reconstruction of the source data from such compressed stream.

For example, the following input, source stream "ABCCC-CABDDDD" is processed to the following compressed data stream, "<m>A <m>B <m>C <m>C <h(C)> <h(C)>, <m>A <h(B)> <m>D <m>D <h(D)> <h(D)>", where "<m>" is a MISS code and "<h(X)>" is a HIT code for the respective character X.

One of the most notable advantages of the present invention is the ability to compress data in resizable blocks that can be set to be as large as a long string or as small as a single character, as in the example above. Once the block size is set, the method has the flexibility to begin the output of the compressed data stream immediately after a single block of input data has been received, and stop and restart such output at any time, and on any block size. This implies the possibility of resuming the process on short string boundaries, or single character boundaries, whenever in time it is needed. These features, taken together, constitute an "exclusive stream" mode of operation, and offer great flexibility to an application by allowing customizing specific compression parameters according to particular data requirements. Exclusive stream mode operation is distinctly different from regular stream mode or block mode. In block mode, a block of data, usually a few kilobytes long, is read and processed by the compressor, after which the compressed data can be output. In regular stream mode the compressor reads characters one at a time, but it will not be able to output any compressed data until an indeterminate number of characters have been processed. This uncertainty can affect the performance of the application, and sometimes make the application impossible under a regular stream or block based compression scheme. The exclusive stream mode of this invention provides the ability to make all communications of the compressed data deterministic in space and time for both string or character boundaries. Additional examples of the use of exclusive stream mode in digital communications and for a chat software application are provided in the detailed description section.

Both compression and reconstruction are symmetrical, reversible processes that use pseudo cache memory as workspace. Such a workspace resembles, in state and behavior, the operation of a real cache memory, as used in computer architecture. The structure of the workspace comprises one or more memory addresses, each memory address having one or more locations to hold one or more distinct values, respectively, followed by an optional status field used for location selection policy to determine how values are replaced. To achieve compression, values are read, one at a time, from the source data stream and mapped into the workspace. Likewise, values are read from the compressed data stream and mapped into the workspace to reconstruct the original uncompressed data stream.

The length in bits of each value or symbol read from the source or compressed stream is determined by the constant N. The number of memory addresses in the workspace is determined by the constant K, which yields $2^K$ possible distinct addresses. The number of locations within each memory address is determined by the constant Lines, which yields that same number of possible distinct locations per memory address. All constants, N, K, and Lines, are defined by the present compression and reconstruction methods, and grouped as specific metrics <N,K,Lines> in order to categorize each method accordingly.

Three workspace arrangements are possible by varying the number of memory addresses and the number of locations in each: a direct-mapped arrangement, defined by metrics <N,K,1>, uses many memory addresses, each holding one value only; a full associative arrangement, defined by metrics <N,0,Lines>, uses one memory address only, holding many values; and a set associative arrangement, the most flexible one, defined by metrics <N,K,Lines>, uses many addresses, each holding many values. By using each of these arrangements as workspace to implement the basic compression and reconstruction processes, together with additional enhancements and variants, a novel family of cache mapping compression (CMC) and reconstruction methods are derived.

The present data compression method removes redundancies within a data stream by using a workspace arrangement with specific metrics <N,K,Lines>. Values from the source data stream are read, in pairs of multiple bit lengths, K bits and N bits, into a buffer or window, and copied into a memory address reference, and a current symbol value, respectively. Therefore, the first K bits are read as a memory address reference, and the N bits that immediately follow are read as the current symbol value to be processed. If K is zero, then the memory address reference is zero.

With the current symbol value and the memory address reference available for processing, the current symbol value is compared with each of the values at the memory address reference. If the current symbol value does not match any of the values at such memory address reference:

(a) a MISS code/value is added to the compressed data stream;

(b) the current symbol value is added to the compressed data stream;

(c) the current symbol value replaces one of the values at the memory address reference; and (d) optionally, a status field in the memory address reference is updated to reflect a change in location usage.

However, if the current symbol value matches any of the values at such memory address reference:

(a) a HIT code/value is encoded, representing the location in the memory address reference where the value was found, and added to the compressed stream; and (b) optionally, a status field in such memory address reference is updated to reflect a change in location usage.

After the current symbol value is processed using the memory address reference as context, the buffer or window is shifted right by N bits in preparation for the next pair of data values until the source data stream is consumed and a complete compressed data stream is created.

The source data is reconstructed from the compressed data by reversing the compression method, as described above. The reconstruction method reuses the same workspace used during the compression method, again with specific metrics <N,K,Lines>, as described above with regard to the compression method. The reconstruction method reads the previous K bits that were previously output to the uncompressed stream as a memory address reference. If K is zero, no bits are read and the memory address reference is also zero. Next, the reconstruction method reads the compressed data, one bit at a time, until a HIT or a MISS code is decoded.

If the decoded value is a MISS code:

(a) N bits are read from the compressed stream as the current symbol value;

(b) the current symbol value is added to the uncompressed stream;

(c) the current symbol value replaces one of the values at the memory address reference; and (d) optionally, a status field in such memory address reference is updated to reflect a change in location usage.

However, if the decoded value is a HIT code:

(a) N bits are read from the memory address reference, at a location specified by said decoded value, as the current symbol value;

(b) optionally, a status field in such memory address reference is updated to reflect a change in location usage; and (c) the current symbol value is finally added to the uncompressed stream.

After the current symbol value is processed using the memory address reference as context, the memory address reference is updated with the previous K bits that were previously output to the uncompressed stream, and the method keeps reading and decoding HIT or MISS code/values until the compressed data stream is completely processed and a complete reconstructed, uncompressed data stream is created. Note that the input operation performed on the uncompressed data stream to read the K bits that will make the memory address reference could be undesirable, or even not possible at all, since the compressed stream is essentially an "output" stream. This input operation on the output stream can be prevented from occurring by performing a shift left operation of N bits from the current symbol value to the memory address reference, which shifts left by N bits as well as a result.

The present invention, in one form, relates to a computer implemented method for compressing electronic data from a source stream of data comprising a string of values, using one or more distinct computer memory addresses as workspace, each computer memory address having one or more locations to hold one or more distinct values respectively. The computer implemented method comprises:

(a) reading K bits from the electronic source data stream, which are immediately prior to a current reading point in the source stream, as a memory address reference, if K is greater than zero;

(b) reading N bits from the source stream as a current symbol value;

(c) writing the current symbol value to replace one of the values at the memory address reference of the computer memory if the current symbol value does not match any of the values at the memory address reference, and writing a MISS code/value followed by the current symbol value to a compressed electronic data stream; and (d) writing a HIT code, representing the location in the computer memory at the memory address reference where the value was found, to the compressed data stream if the current symbol value matches any of the values in the computer memory at the memory address reference.

Advantageously, (a) through (d) are repeated after initialization of all values at each memory address, wherein at (a), the leftmost bits of the memory address reference are properly initialized if they are not available for reading from the source data stream.

The present invention, in another form thereof, relates to a computer implemented method for compressing electronic data from a source stream of data comprising a string of values, using one or more distinct computer memory addresses as workspace, each computer memory address having one or more locations to hold one or more distinct values respectively. The computer implemented method comprises:

(a) reading K bits from the electronic source data stream, which are immediately prior to a current reading point in the source stream, as a memory address reference, if K is greater than zero;

(b) reading N bits from the source stream as a current symbol value;

(c) writing the current symbol value to replace one of the values at the memory address reference of the computer memory if the current symbol value does not match any of the values at the memory address reference, and writing a MISS code/value followed by the current symbol value to a compressed electronic data stream; and (d) writing a HIT code to the compressed data stream, in which the HIT code represents a least recently used (LRU) counter value associated with the location in the computer memory at the memory address reference where the value was found, the HIT code being assigned a shorter code if the LRU counter of said location has a higher value or a longer code if said location has a lower value, wherein LRU counters are associated with each location in the memory address, and said LRU counters represent a usage rank for each location so that higher LRU counter values represent more recently used locations and lower LRU counter values represent least recently used locations.

The present invention, in another form thereof, relates to a method for reconstructing an uncompressed source data stream from compressed data comprising at least some of the source data along with compression codes comprising MISS and HIT codes, using one or more distinct computer memory addresses as workspace, each computer memory address having one or more locations to hold one or more distinct values respectively. The computer implemented method comprises:

(a) reading K bits from the uncompressed data stream, which are immediately prior to the current insertion point in the uncompressed stream, as a memory address reference, if K is greater than zero;

(b) reading a code value from the compressed data stream, said code value representing either a HIT encoded location or a MISS occurrence;

(c) if the value is a MISS code, reading N bits from the compressed stream as the current symbol value, writing the current symbol value to replace one of the values in the computer memory at the memory address reference obtained in (a), and writing the current symbol value to the uncompressed stream; and (d) if the value is a HIT code, reading N bits from the location given by the decoded HIT code in the computer memory at the memory address reference obtained in (a) as the current symbol value, and writing the current symbol value to the uncompressed stream.

The present invention, in yet another form thereof, relates to a system for compressing electronic data from a source stream of data comprising a string of values, using one or more distinct computer memory addresses as workspace, each computer memory address having one or more locations to hold one or more distinct values respectively. The system comprises:

computer memory having one or more distinct computer memory addresses, each computer memory address having one or more locations to hold one or more distinct values, respectively; and a processor for:
  (a) reading K bits from an electronic source data stream, which are immediately prior to a current reading point in the source stream, as a memory address reference in the computer memory, if K is greater than zero;
  (b) reading N bits from the source stream as a current symbol value;
  (c) writing the current symbol value to replace one of the values at the memory address reference of the computer memory if the current symbol value does not match any of the values at the memory address reference, and writing a MISS code/value followed by the current symbol value to a compressed electronic data stream; and
  (d) writing a HIT code, representing the location in the computer memory at the memory address reference where the value was found, to the compressed data stream if the current symbol value matches any of the values in the computer memory at the memory address reference.

The present invention, in another form thereof, relates to a system for compressing electronic data from a source stream of data comprising a string of values, using one or more distinct computer memory addresses as workspace, each computer memory address having one or more locations to hold one or more distinct values respectively. The system comprises:

computer memory having one or more distinct computer memory addresses, each computer memory address having one or more locations to hold one or more distinct values, respectively; and a processor for:
(a) reading K bits from the electronic source data stream, which are immediately prior to a current reading point in the source stream, as a memory address reference, if K is greater than zero;
(b) reading N bits from the source stream as a current symbol value;
(c) writing the current symbol value to replace one of the values at the memory address reference of the computer memory if the current symbol value does not match any of the values at the memory address reference, and writing a MISS code/value followed by the current symbol value to a compressed electronic data stream; and
(d) writing a HIT code to the compressed data stream, in which the HIT code represents a least recently used (LRU) counter value associated with the location in the computer memory at the memory address reference where the value was found, the HIT code being assigned a shorter code if the LRU counter of said location has a higher value or a longer code if said location has a lower value,
wherein LRU counters are associated with each location in the memory address, and said LRU counters represent a usage rank for each location so that higher LRU counter values represent more recently used locations and lower LRU counter values represent least recently used locations.

The present invention, in yet another form thereof, relates to a system for reconstructing an uncompressed electronic source data stream from compressed electronic data comprising at least some of the source data along with compression codes comprising MISS and HIT codes. The system comprises:

computer memory having one or more distinct computer memory addresses, each computer memory address having one or more locations to hold one or more distinct values, respectively; and a processor for:
(a) reading K bits from the uncompressed data stream, which are immediately prior to the current insertion point in the uncompressed electronic stream, as a memory address reference of the computer memory, if K is greater than zero;
(b) reading a code value from the compressed electronic data stream, said code value representing either a HIT encoded location or a MISS occurrence;
(c) if the value is a MISS code, reading N bits from the compressed stream as the current symbol value, writing the current symbol value to replace one of the values in the computer memory at the memory address reference obtained in (a), and writing the current symbol value to the uncompressed stream; and
(d) if the value is a HIT code, reading N bits from the location given by the decoded HIT code in the computer memory at the memory address reference obtained in (a) as the current symbol value, and writing the current symbol value to the uncompressed stream.

BRIEF DESCRIPTION OF THE FIGURES

FIG. 7 is a diagram of the workspace or pseudo cache memory used by all compression and reconstruction methods disclosed in the present invention;

DETAILED DESCRIPTION

The present cache mapping compression (CMC) method is based on a model that resembles the internal data caching mechanism that occurs inside a computer, between a central processing unit (CPU) and main memory. One difference is that the present CMC method exploits the data locality properties of the cache in an attempt to produce compression, rather than speeding memory access as it does in the case of computer architecture. The CMC methods explained here represent states in a finite state automaton, and as such, can either be implemented as software or hardware artifacts. As used throughout this disclosure, when referring to compressing data, the input and output streams refer to the source and compressed streams, respectively. Similarly, when reconstructing, the input and output streams correspond to the compressed and reconstructed streams, respectively.

The present method considers both the source stream and reconstructed streams as a sequence of fixed length N-bit values called blocks. The reason for operating on N-bit data blocks, instead of processing source symbols directly, is twofold. First, a block is the same size as a cache line, the minimal data transfer unit within the cache. Secondly, the block size can be set independently of the length in bits of the source symbols. This, in turn, allows more control over the compression parameters, allowing them to better match the characteristics of the source stream and, thus, attempt better compression ratios. However, for the sake of clarity when presenting the proposed claim set, N-bit data blocks are also referred to as current symbol values.

The CMC compression method reads one N-bit data block at a time from the source stream. If the current block is found at a specific location in the cache, then a hit occurs; otherwise, a miss results. Next, the compression method outputs one of two possible sequences; either a Hit Code consisting of H bits or a Miss Code consisting of M bits, followed by the current data block. The compression method continues until all blocks from the source stream are processed.

Figure 1:
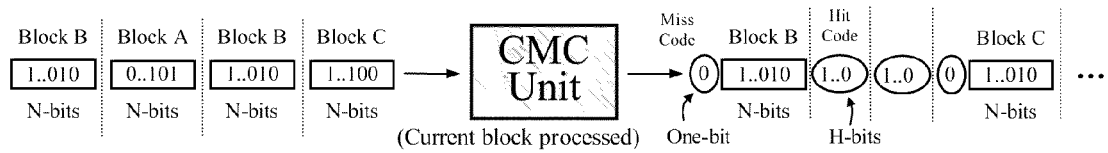
FIG. 1 is a diagram depicting input and output sequences of a cache mapping compression method in accordance with the present invention, where the labeled blocks refer to symbol values read from the source data stream.

FIG. 1 shows the state of an arbitrary stream of blocks B, A, B, C, before and after compression. For example, if the input sequence is {B, A, B, C . . . }, the hypothetic compressed output sequence is {<miss> <B>, <hit> (for A), <hit> (for B), <miss> <C> . . . }. By comparing both sequences, it can be seen that the first and last blocks feature an expansion of M bits for each miss, while the middle two blocks contribute a compression factor of (N−H) bits for each block. Therefore, by knowing the total number of hits, it is possible to calculate the compression ratio exactly.

There is a conceptual difference between miss codes and hit codes. A miss code simply serves as a boolean marker. It informs the reconstructor that a miss occurred and, hence, that the missed block follows next. In contrast, a hit code not only indicates that a block was successfully cached, depending on the cache metrics, a hit code must also encode the line number in the set where the hit occurred. Note that a miss code is defined as a one bit value for convenience, but a tradeoff could be made with the hit code length in order to minimize the average length code for both. Note that the line number and the set are also referred to as the location number and the memory address reference, respectively.

By visual inspection of the output sequence in FIG. 1, it is evident that compression improves as more hit codes emerge on the output, while it degrades when the code length for those hits and misses increase. The number of hits can be maximized by arranging more lines per set but, unfortunately, doing so also increases the hit code length. Therefore, there is evidently a minimization problem involved.

If the current block is found at a specific location in the cache, a hit occurs. The specific location where the current block is actually mapped is crucial. This mapping is what allows the production of hits in the first place and, as FIG. 1 reveals, what allows reducing the size of the output sequence to achieve compression. In order for a block to be cached, two inputs are needed: a block and an address. The address will determine the cache set where the block will be mapped, and thus, it is also referred to as the "cache mapping address".

In order to extract an appropriate mapping address function for the incoming blocks, it is helpful to visualize the types of data redundancy that can be typically exploited in text: string matches and character runs. Consider the following sequence:

ABCCCCABDDDD . . .

In this sequence, there is only one string match (the substring "AB" that matches the second substring "AB") and two characters runs ("CCC . . . " and "DDD . . . "). For the CMC compressor to be effective, it must exploit these redundancies by making incoming blocks (characters) produce hits for the blocks already encountered in the cache. This translates into obtaining the same mapping address for both so that their block contents match when compared. Assume that the first three characters, "ABC", in the sequence have already been processed. Such a cache state is shown in Table 1.

TABLE 1

| Mapping Address | Cache Line |
|---|---|
| ? | A |
| ? | B |
| ? | C |

To obtain hits for the next "CCC . . . " character runs that follow, each incoming "C" should be cached in the same mapping address as the previously encountered "C". This leads to using the previous characters themselves as input to the cache mapping address; that is, using the equivalent computer binary representation of the previous characters to generate the cache mapping address. Consequently, if a "C" character is cached in a line whose mapping address is a function of the previous character "C", new consecutive "C" characters will produce hits when compared since their mapping address will be the same.

Figure 2:
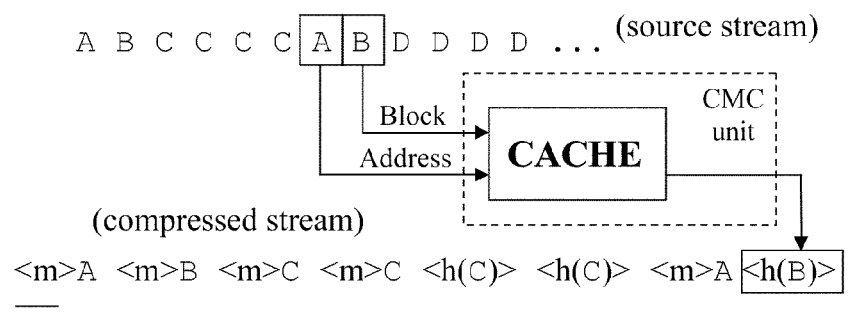
FIG. 2 is a diagram depicting a cache mapping compression in accordance with the present invention, where the lines labeled Block and Address refer to the current symbol value and the memory address reference, respectively.

FIG. 2 illustrates the CMC compression method in more detail when the mapping address, K, is 8 bits long, the current block size, N, is also 8 bits long, and each memory address contains one location only to hold the data blocks. The current block read from the source stream receives the current character (8 bits), and the mapping address is assigned the previous character (8 bits). The compression method has just processed the first 8 characters of the source stream and has output the resulting sequence in the compressed stream. Miss codes and hit codes are represented as <m>X and <h(X)>, respectively, where X is the block that resulted in either a miss or a hit. FIG. 2 also shows the current state of the cache (after the second substring "AB" is processed) and the final state (after the last "D" character is processed). Hits are shown in circles inside the cache, and the rest are misses.

As shown in FIG. 2, the compression process not only detects the character runs "CCC . . . " and "DDD . . . ", but also the string matches, by detecting the second substring "AB" and producing the corresponding hit on the character "B". Note that the cache line holds only one block at any given time. This is the case for direct-mapped cache arrangements, as will be discussed in further detail below with reference to FIG. 4. The rightmost character represents the most recent block in the cache. When a hit occurs, the current block is not cached again, although it is represented in the cache with a circle, for illustration purposes, to indicate that such a block resulted in a hit. The mapping address actually refers to a specific set in the cache.

The CMC codec is tightly coupled with the internal cache structure used. Accordingly, modifying the cache metrics, the number of lines per set for instance, has the effect of drastically changing the behavior of the present compression method.

The present CMC method can be defined in terms of three parameters (N,K,Lines) and one code. The parameters describe the metrics of the internal cache (bits per block, bits for set addressing, number of lines), and the code defines the encoding used to represent hits and misses in the compressed stream. Lines can also be defined in terms of L, the number of bits needed to encode $2^L$ lines.

The present CMC compression method may be implemented, advantageously, using one of three specific cache structures. The three cache structures define three specific forms of the present compression method, and are referred to as: direct-mapped, set associative, or full associative. The three methods will be described with reference to pseudo code, for explanatory purposes, to provide a better understanding of the present compression method and the three advantageous implementations, without implementation details, which will be evident to one of ordinary skill in the art.

Figure 3:
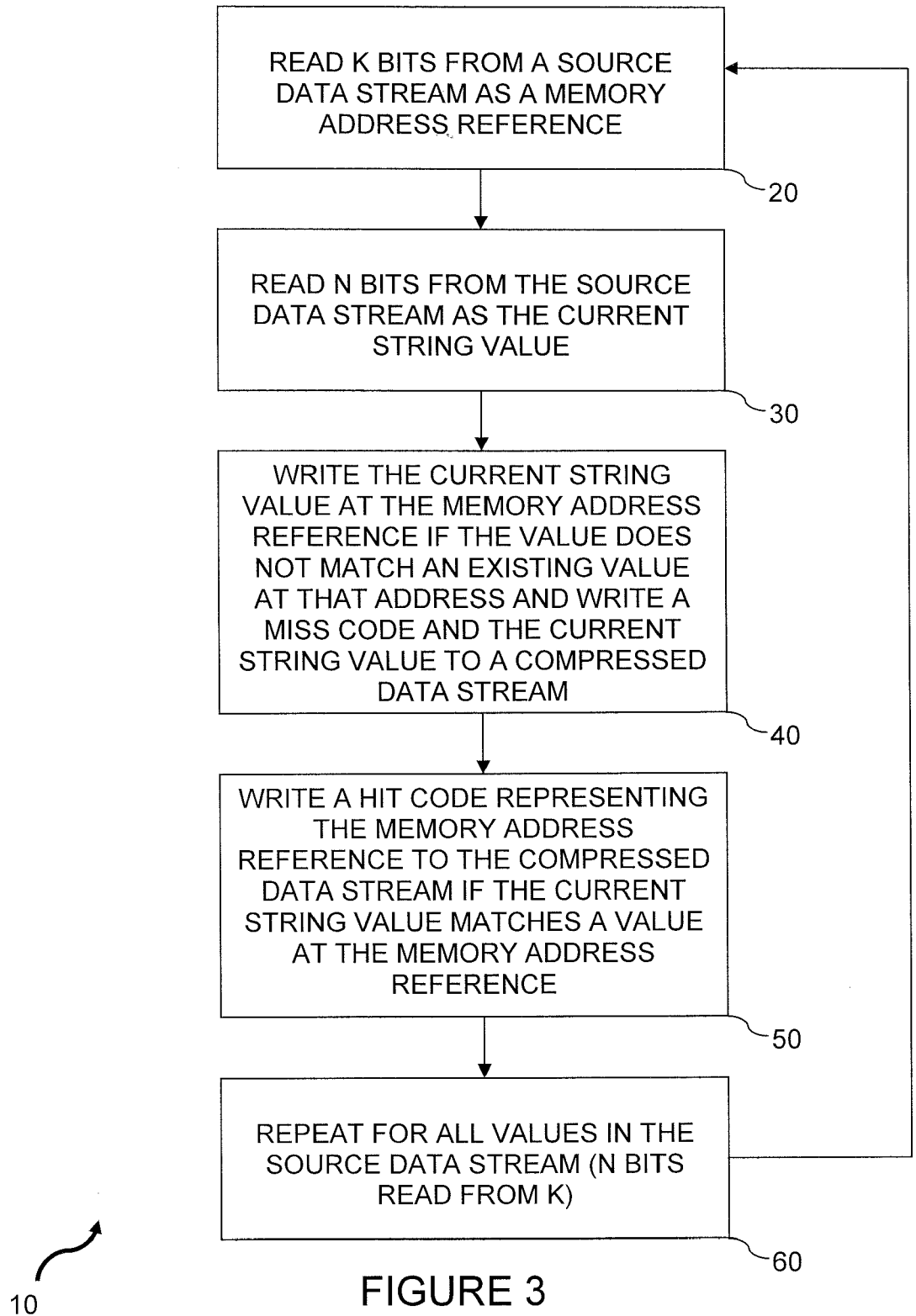
FIG. 3 is a flow chart depicting a general cache mapping compression (CMC) method in accordance with the present invention.

Referring generally to FIG. 3, method 10 depicts a generic implementation of the present CMC method. Method 10 compresses data from a source stream of data comprising a string of values, using one or more distinct computer memory addresses as workspaces. Each computer memory address has one or more locations to hold one or more distinct values, respectively.

K bits are read or input from the source data stream, which are immediately prior to the current reading point in the source data stream, as a memory address reference, if K is greater than zero (step 20). If there are no bits prior to the current reading point, no K bits will be read, and K will be assigned the value zero. For example, referring to FIG. 2, along with FIG. 3, if the source data stream is "ABCCCAB-DDD", the initial, first reading point is the first A. Since A is in the first position, there are no bits preceding A and, therefore, no K bits will be read from the source data stream. Accordingly, K is assigned the value zero.

Next, N bits are read from the source stream as a current symbol value which, in this example, is an A (step 30).

The current symbol value, i.e. A, is written to replace one of the values at the memory address if the symbol value does not match any of the values at the memory address reference. In addition, a miss code, "<m>", followed by the current symbol value, is written to the compressed data stream. In this example, the current symbol value, i.e. A, does not match any value, in fact the only value, at the memory address, which is zero and, therefore, a miss code, <m>, followed by an A, is written to the compressed data stream (step 40).

A hit code is written, representing the location of the memory address reference where the value is found, to the compressed stream if such current symbol value matches any of the values at the memory address (step 50). In this example, since the value A is not found at any location in the memory address at memory address zero, a hit value is not written to the compressed data stream.

At step 60, the method is repeated for each value in the source data stream after an initialization of all values at each memory address, wherein the leftmost bits of memory address reference are properly initialized if they are not available from the source data stream (step 60). Accordingly, step 20 is repeated for a first time where K bits from the source data stream are read or input immediately prior to the current reading point, which is now B, and the memory address reference is assigned a value immediately prior to the current reading point, namely A (step 20). Next, the value B is read as the N bits from the source data stream, and assigned to the current symbol value (step 30). At step 40, the current symbol value is written to replace the value at memory address A since the current symbol value, namely B, does not match any value, in fact the only value, at the memory address A (step 40). Subsequently, a miss code followed by the current symbol value, i.e. B, is written to the compressed data stream. As a result, the current compressed stream now comprises <m>A<m>B.

The method 10 is repeated two more times for the next two values, namely C and C. During a fifth iteration of method 10, the fifth value is read, namely the third C from the left, as the N bits from the source stream (step 30) and the immediate prior value is input, which is also C, as a memory address reference (step 20). At step 40, since the current symbol value, C, in fact, does match the current value at memory address corresponding to C, no miss code or current symbol value is written to the compressed stream. Instead, at step 50, a hit code, representing the location in the memory address reference where the value C was found, is written to the compressed data stream since the current symbol value, C, matches one of the values at the memory address reference C. Accordingly, the current compressed data stream now is <m>A, <m>B, <m>C, <m>C<h(C)>. Method 10 is then repeated until all values are processed.

Method 10 can be modified, as desired, to optimize processing time and efficiency, as well as compression gain, i.e. the size of the compressed data stream with respect to the size of the source data stream. One modification is to vary the way HIT/MISS codes are assigned. The HIT/MISS codes may be statically defined, i.e. predefined, and thus not change through the compression method 10, and subsequent decompression process. Alternatively, the HIT/MISS codes can be adaptively assigned such that during compression method 10, the HIT/MISS codes can change.

One exemplary way for adaptively assigning HIT/MISS codes includes initially assigning one bit to a MISS code and L+1 bits to the HIT codes representing the locations of the matched values inside a current memory address. Any consecutive repeating code, HIT or MISS, longer than one bit will swap bit encodings with the current one-bit code, HIT or MISS, and said new encodings will be in effect until a different consecutive repeating code longer than one bit is detected, in which case a new bit encoding will be assigned, accordingly.

In an additional modification to method 10, at step 20, the K bits read may be reduced/converted into fewer or the same number of bits to produce a resulting word which is used as memory address reference. For example, the K bits read are then converted into an equal or lesser number of bits, possibly after a hashing strategy seeking to reduce workspace size, and then used as memory address references in successive steps for both compression and reconstruction methods.

One way to convert the K bits into a fewer number of bits, thus reducing the amount of memory needed for workspace, is by using a hashing strategy whereby the K bits are input to a hash function which converts the K-bit value into a smaller R-bit value before it is used as a memory address reference. To illustrate a simple, yet powerful, hash function consider the modulus operator, which returns the remainder of the division of two integers. That is, if D and d are integers where D>d, then "D modulus d" returns the remainder of D/d, which is guaranteed to be another integer between 0 and d−1. This can be very convenient if all $2^K$ memory addresses that are read from the source stream cannot be addressed in the available workspace memory. In such a case D is assigned the original memory address reference, d is assigned the total number of real memory addresses available, $2^R$, and the result of "D modulus d" is assigned to the new reduced memory address reference and used thereafter to address the workspace.

In order to further illustrate the effect of implementing a hashing function in the present data compression method, the following are two exemplary set calculations are provided, written in C programming code, one with no hashing and the other one with hashing.

```
Set calculation with NO hashing:
- set = ((set << N) | symbol) & (SETS_TOTAL-1);
    //bits shifted left = N
    //'|' is bitwise 'OR' operator
    //'&' is bitwise 'AND' operator
    //'SETS_TOTAL' is the total number of sets (memory addresses)
    defined
    //    as 2 to the power of K; or in C syntax: SETS_TOTAL = 1 << K.
Set calculation with *hashing*:
- set = ((set << (N – H)) ^ symbol) & (SETS_TOTAL-1);
    //bits shifted left = N–H (i.e. amount lesser than N bits)
    //'^' is bitwise 'XOR' operation
    //'&' is bitwise 'AND' operator
    //'SETS_TOTAL' is the total number of sets (memory addresses)
    defined
    //    as 2 to the power of K; or in C syntax: SETS_TOTAL = 1 << K.
```

For this example, K=15 and H=3, where H is the number of bits to overlap in the calculation, as shown below.

```
21076543210765432107 6543210        (bit position inside bytes)
-----------------------------
22222222111111111                   (bit count - 10s)
6543210987654321098 76543210         (bit count - 1s)
-----------------------------
        -->...... K ..... <-- (15 bits in this case)
        |   --> H <-- (3 bits in this case)
        |      76543210
        |      xor
        | 76543210
        | xor
        76543210         <-- bits 0 through 20 (21 bits used)...b3b2b1b0|symbol
    xor                                            <- K | N ->
    76543210
    xor
76543210
...
```

In implementing the hashing function, one can find the "virtual K" (VK), which is the number of input bits used for hashing read from the source stream. This is useful to determine the number of effective bits that are "touched" from the source stream when calculating the K-bit set. It is important because it defines the "context" for the current symbol and it affects compression. When H=0 (no hashing), VK=K; when H>0 (hashing present), VK>K. As a result, the problem is to find VK given K and H.

Solving for VK is done based on recognizing that intuitively, VK is hashed down by H bits during each SHIFT/XOR. If this is done n times, then VK will be completely hashed down to K bits after H*n reductions. The formula is thus: VK−H*n=K, where n is the # of overlappings or xor's performed and it clearly depends on K and H. Also, note that, intuitively, n is the number of times that the 8's complement of H fits in K−1. Therefore, one can find VK with the following two sets of equations:

\*$n=(K-1)/(8-H)$ (integer division of course)

\*$VK=K+H*n$

Hence, $VK=K+H*(K-1)/(8-H)$

The following Table 2 lists potential K, H combinations to yield a specific VK value.

TABLE 2

Potential K, H combinations to yield a specific VK value:

|           | H (input) |    |    |    |    | VK       |
|-----------|-----------|----|----|----|----|----------|
|           | 0         | 1  | 2  | 3  | 4  | (output) |
| K (input) | 12        | 11 | 10 | 9  | 8  | 12       |
|           | 13        | 12 | 11 | 10 |    | 13       |
|           | 14        | 13 | 12 |    |    | 14       |
|           | 15        | 14 |    |    |    | 15       |
|           | 16        |    |    |    |    | 16       |
|           | 17        | 15 | 13 | 11 | 9  | 17       |
|           | 18        | 16 | 14 | 12 | 10 | 18       |
|           | 19        | 17 | 15 | 13 | 11 | 19       |
|           | 20        | 18 | 16 | 14 | 12 | 20       |
|           | 21        | 19 | 17 | 15 |    | 21       |
|           | 22        | 20 | 18 |    |    | 22       |
|           | 23        | 21 |    |    |    | 23       |
|           | 24        |    |    |    |    | 24       |
|           | 25        | 22 | 19 | 16 | 13 | 25       |

At step 20, an optional status field of the memory address can be used for tracking location usage inside the memory address. Then, as the method proceeds, at either steps 40 or 50, the status field is updated after reading/writing a value as the memory address. The status field is used in a set associative compression method to track how values are replaced when a miss occurs.

The status field might be used differently according to the strategy used to replace values when a miss occurs, that is, when the current symbol value does not match any of the values at the memory address reference at all. Regardless of the strategy, the expectation is that the status field provides the best estimate of the location to use when replacing a value for a specific memory address. In practice, the status field contains as many counters as locations exist at a memory address. Each counter keeps track of a specific location by storing a rank that represents the order by which each location should be replaced, according to the specific replacement policy in place. For instance, assume a least recently used (LRU) replacement strategy, with 4 locations per memory address, and a status field containing, at some point, the following values stored in each of the 4 counters associated with each location: 3, 1, 0, 2. This means that location numbers 0, 1, 2, 3 in the memory address have associated LRU counters in the status field with values 3, 1, 0, 2. Under an LRU strategy this means that location 0 is the most recently used because it has the highest LRU counter with value 3, next is location 3 with LRU counter=2, location 1 follows with LRU counter=1, and finally location 2 with LRU counter=0. Therefore, when a value is about to be replaced, the location number associated with the lowest LRU counter value will be selected for replacement, or location 2 in this case, because it represents the least recently used location, as the replacement strategy itself suggests. On the other hand, the status field might be implemented differently if another strategy is used, as in the oldest value replacement policy, whereby the status field is preferably conceived as a first in first out (FIFO) queue, instead of counters, where new replaced locations are added to the front of the queue and the oldest location used for replacement is obtained from the tail. Regardless of the replacement strategy used, the status field is used to determine which location should be selected when replacing a value, after a miss has occurred.

Figure 5:
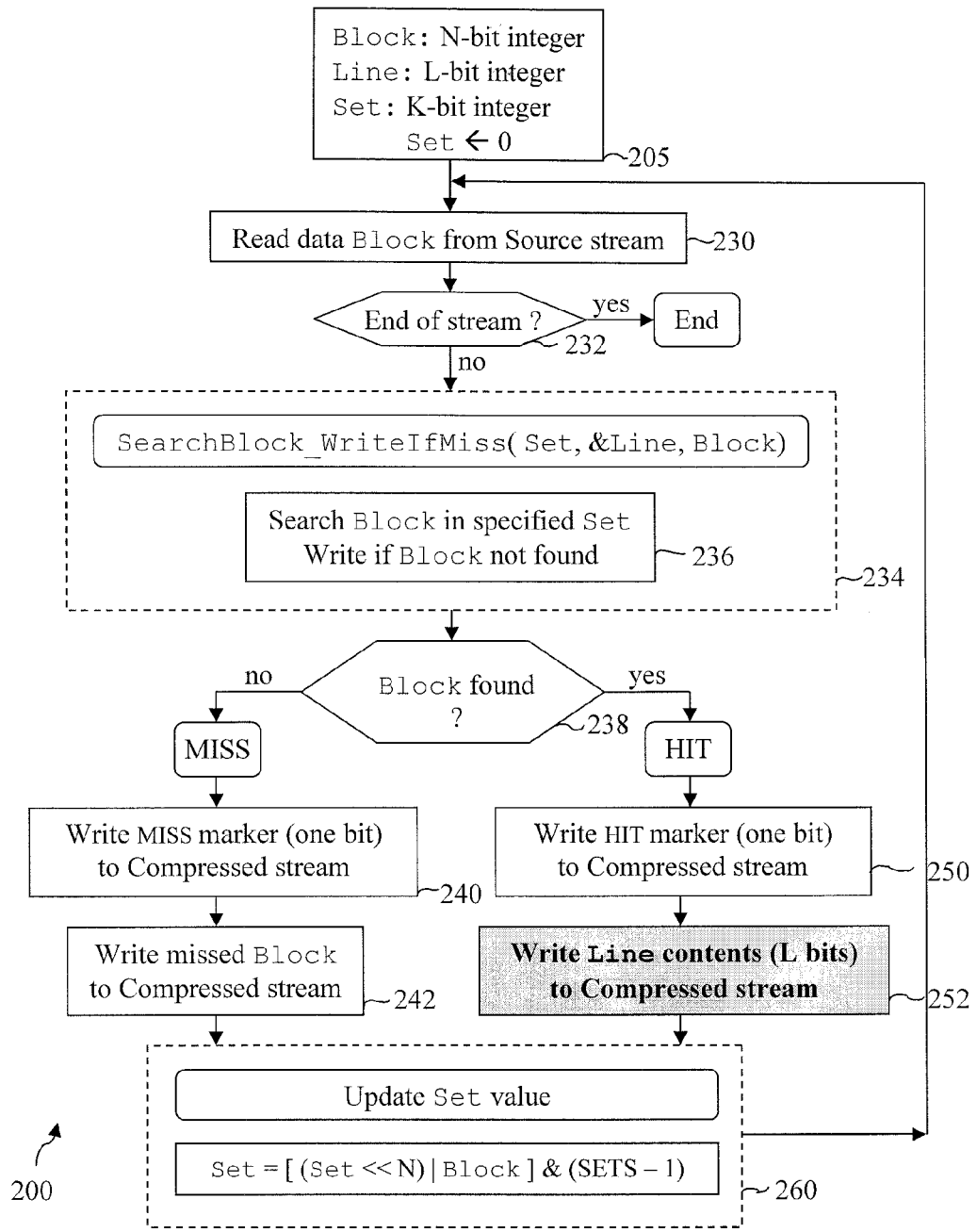
FIG. 5 is a flow chart depicting a set associative CMC compressor method in accordance with the present invention, where the variables Block, Line, and Set refer to the current symbol value, location number (inside a memory address), and the memory address reference, respectively.
Figure 6:
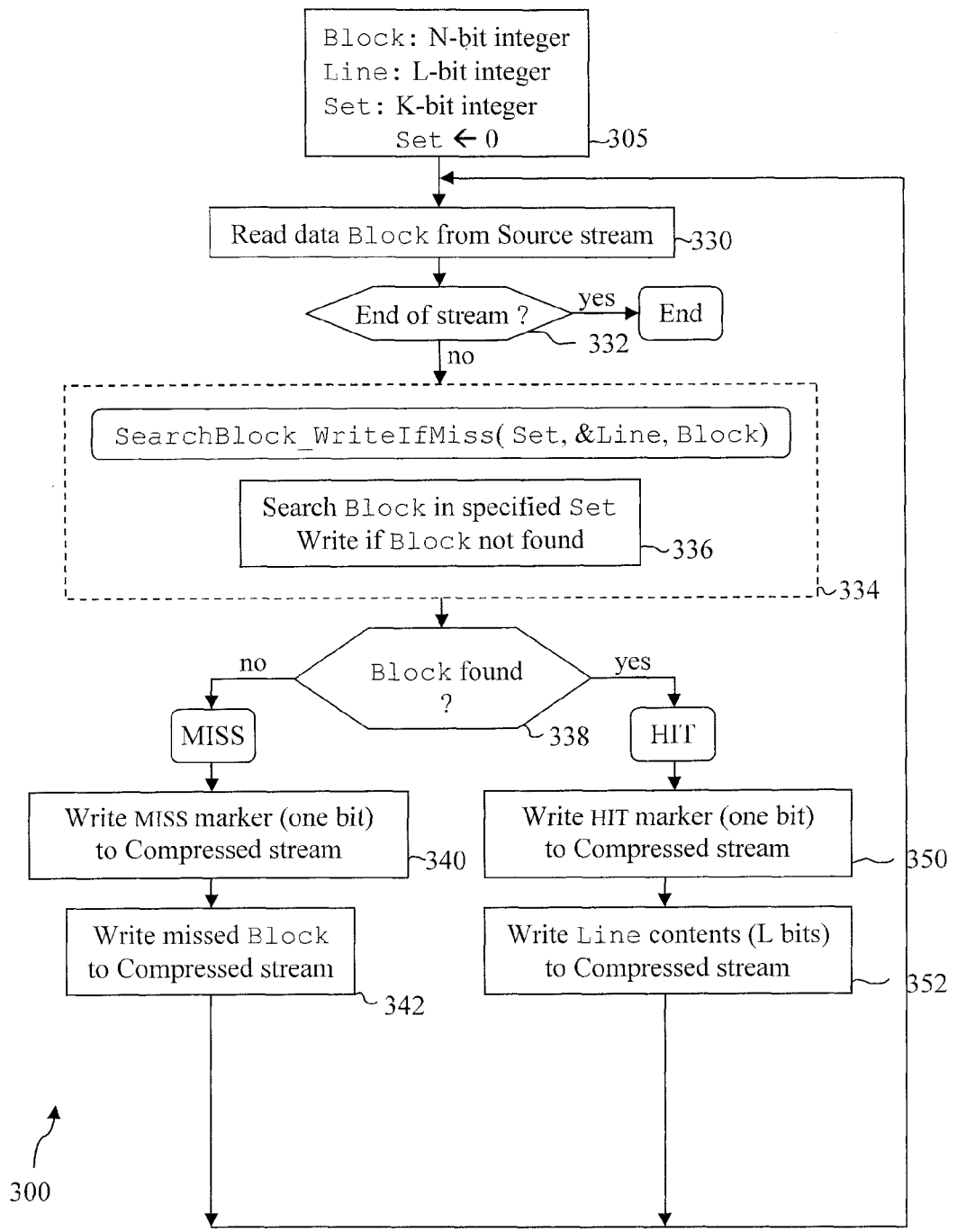
FIG. 6 is a flow chart depicting a full associative CMC compressor method in accordance with the present invention, where the variables Block, Line, and Set refer to the current symbol value, location number (inside a memory address), and the memory address reference, respectively.

Method 10 can be modified to include various compression schemes, which use various cache structures, which include a direct-mapped CMC method 100 (FIG. 4), a set associative CMC method 200 (FIG. 5) and a full associative CMC method 300 (FIG. 6).

Figure 4:
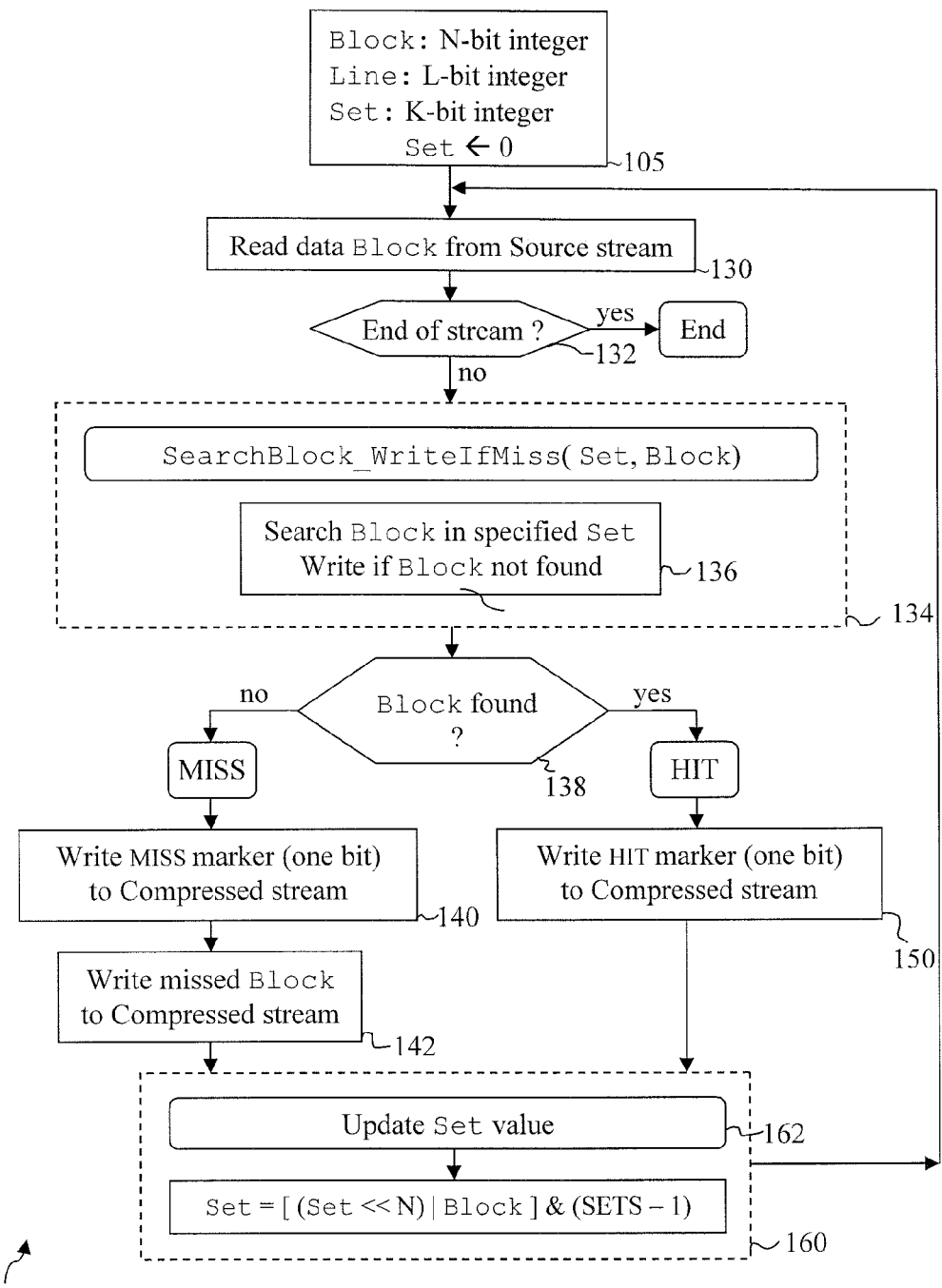
FIG. 4 is a flow chart depicting a direct-mapped CMC compressor method in accordance with the present invention, where the variables Block, Line, and Set refer to the current symbol value, location number (inside a memory address), and the memory address reference, respectively.

Referring to FIG. 4, in general, method 100 employs a simple cache arrangement. In this arrangement, the cache consists of one line per set, where only one data block can be stored at any specified set; therefore, the cache metrics <N,K,1>. This structure simplifies internal block handling since there is no replacement policy involved or, conversely, the strategy is minimal, i.e. if a miss occurs, then replace the only block available in the set. Direct-mapped caches do not require status bits for a replacement policy which is implemented in the set associative compression method 200 and full associative compression method 300. Therefore, direct-mapped caches are faster and less resource intensive than set associative or full associative caches, in accordance with other aspects of the present invention. However, the tradeoff is a lower hit rate when compared with other arrangements.

Referring now specifically to FIG. 4, direct-mapped CMC compression method 100 includes locating variables that hold a current Block, Line, and Set, which are declared. Again, these represent the current symbol value, location number, and memory address reference, respectively. Like steps of method 10 (FIG. 3) are increased by 100 in FIG. 4. The Set is initialized to zero (step 105). N bits from the source data stream are read and copied to Block and, if the stream refers to a file, the associated file pointer is updated, i.e. moved forward by N bits (step 130). The data block is read from the source stream as long as the end of the data stream is not reached (step 130).

The current block is searched in the specific set, and since there is only one line per set in a direct-mapped cache, only that line is searched (step 134). If the block does not match the contents of the line, a miss occurs, and the block is written to the cache line (step 136).

Further, if the block is not found, one bit value that serves as a "miss" code or marker is written to the compressed stream (step 140). The value of the marker is the constant MISS (step 140). Further, the current block is written to the compressed stream (step 142). During reconstruction or decompression of the compressed data stream, the reconstruction method cannot obtain the block from the cache since a miss occurred, as will be discussed in more detail to follow. Therefore, the block needs to be replicated in a compressed stream so that it can be recovered later (step 142).

Alternatively, if the block is found (step 136), one bit value is written to the compressed stream to indicate that a hit occurred (step 150). The hit marker is used during a reconstruction method to extract a block from the cache. Since there is only one line per set in the direct-mapping method 100, it is not necessary to encode the line number in the compressed stream at step 150.

The value of the current set is prepared for the next iteration of method 100 (step 160). The update process is conceptually analogous to a "shifting placeholder" on top of the source stream that shifts N bits to the right at the end of each iteration round, and reads K bits from that point in the stream, as shown in FIG. 2. This operation is basically equivalent to shifting the contents of the set variable N bits to the left and reading N bits from block, since the current block contains the same N bits just read from the source stream.

The direct-mapped compression method 100 uses a specific direct-mapped workspace with metrics <N,K,1>. In this arrangement, only one location or line per memory address is used, which allows only one value to be stored. This makes replacement of missed values trivial since neither a policy nor a status field is needed. Also, since each memory address has one location to store one value only, the HIT codes represent the simple occurrence of a value found in the current memory address reference, i.e. the occurrence of the hit itself.

Referring now to FIG. 5, method 200 is a set associative CMC compression method form of the present compression method, where like steps to methods 10 and 100 are raised by 100 and 200, respectively. As with method 100, at step 205, Block, Line and Set are initialized. Next, a data block is read from the source data stream. Unlike direct-mapped method 100, there is more than one line to search. Therefore, all lines from a specified set are searched (step 234). If the block does not match the contents of any line, a miss occurs and the block is written to the cache (step 236).

Similarly to method 100, if the block is found, one bit value indicating a hit is written to the compressed stream (step 250). However, since there is more than one line per set, during reconstruction of the uncompressed data stream, there is no way of knowing from which line the reconstruction method should retrieve the block. Consequently, a hit marker is not sufficient and the reconstruction method needs a line number where the hit occurs, which is passed into the next step.

After the hit marker is written, the line number where the hit occurs is encoded and written to the compressed stream (step 252). The encoding need only be sufficient to identify the line and, therefore, can be as simple as a fixed code length consisting of L bits that hold the binary representation of the line number (step 252).

However, if a miss occurs, step 200 proceeds in a similar manner as step 100, which includes writing a miss marker to the compressed stream (step 240) and writing a miss block to the compressed stream (step 242), and the value of the current set is prepared for the next iteration (step 260).

In one specific further implementation of method 200, method 200 may further include a replacement policy to decide which location should be used when replacing a value. This is done internally by the method or function Search-Block_WriteIfMiss( ) (step 236). Typical replacement policies include, in order of most preferable to least: least recently used (LRU), first in first out (FIFO) or oldest used, least frequently used (LFU), random, etc. The methods associated with these replacement policies are invoked inside the methods ReadBlock( ), and SearchBlock_WriteIfMiss( ) whenever a block is accessed for any reason inside the cache (steps 230 and 236).

In order to understand how a replacement strategy works, the least recently used (LRU) replacement policy is explained next using the following concrete example. Consider a memory address with 4 locations and, thus, a status field containing 4 LRU counters associated with each. Assume that at some point during the compression process the LRU counters contain the values 3, 0, 2, 1, respectively. This means that location 0 is the most recently used location since its associated LRU counter has the maximum value 3, while location 1 is the least recently used location since its associated LRU counter has the minimum value 0. Therefore, when a miss occurs, location 1 will be selected for replacement since its LRU counter is 0, indicating that it is the least recently used. Now, assume that a hit occurs on location 3.

The LRU counters in this example are updated as follows. Since location 3 is now the most recently used, all LRU counters need to be updated accordingly to reflect the new change in location usage. This is the generic process of updating the LRU counters: the current LRU counter value, associated with the location where the hit occurs, is read as T. Next, all LRU counters with values greater than T are decremented by one. Finally, the current LRU counter is assigned the maximum value, thus tagging it as the most recently used location. Therefore, when a hit occurs on location 3, with current LRU counter values 3, 0, 2, 1, such counters are updated as follows: T is assigned 1, the LRU counter value of location 3. Next, all LRU counters with values greater than T=1 are decremented by one. So, the LRU counters become 2, 0, 1, 1. Finally, the current LRU counter is assigned the maximum value, 3. Hence, the LRU counters now become 2, 0, 1, 3. Briefly, the LRU replacement policy works in such a way that there will always be different LRU counter values, representing the usage rank for each location.

In an alternative further form, a variable length coding scheme can be used for the hit and miss codes assigned in such a way that the lower locations, which are most regularly used, are represented using shorter codes while the higher locations, used less often, are assigned longer codes.

Some of the variable length coding schemes available in the literature can be used to assign hit and miss codes. For instance, if the number of locations per memory address is small, say 2, 3, or 4, then Huffman can be used to represent each location number. If the number of locations is larger, then start-step-stop codes would be preferably since they are generated much faster than Huffman schemes.

For example, a variable length coding scheme can include two passes. The first pass is used to calculate the usage frequency at each location and a second pass is used to assign the variable length codes that will represent each location in such a way that the most frequently used locations are assigned shorter codes, while the least frequently used locations are assigned longer codes. For example, assume that two locations per memory address are used. Consequently, the first pass is performed by executing the compression method in order to count the percentage of misses and the percentage of hits that occur on location 0 and location 1. Therefore, during the first pass no output is written to the compressed stream.

Figure 11:
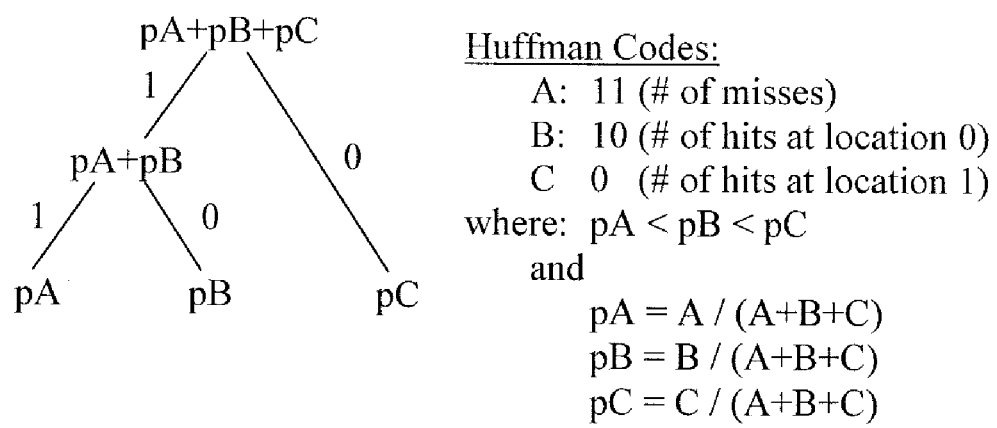
FIG. 11 depicts a Huffman tree showing how Huffman codes are assigned in accordance with the present invention.

After the percentages are obtained as pA, pB, and pC, where pA is the percentage of misses, pB is the percentage of hits on location 0, and pC is the percentage of hits on location 1, then a Huffman tree is created for pA, pB, and pC, and Huffman codes are assigned to represent misses (A), hits on location 0 (B), and hits on location 1 (C), as shown in the Huffman Tree of FIG. 11. If A <B<C, which means that pA<pB<pC, then A, B, and C will have the following Huffman codes assigned: 11, 10, and 0.

Further, as an alternative, rather than encoding a location number, the value of the LRU counter, kept in the status field, one for each location, is encoded instead. The LRU counters are used to implement the LRU replacement policy and represent a usage rank for each location so that higher values represent more recently used locations and vice versa. Therefore, higher LRU count values are assigned shorter codes while the lower values are assigned longer codes. The reasoning behind encoding the LRU counter associated with the cache line, instead of encoding the cache line number itself, is the following: Since the lines that are more recently used have more chance of obtaining future hits than the less recently used, the usage rank of each line can be correlated with the probability of hit occurrence on that line. Hence, under this assumption the line counter with the highest rank will have a higher chance of obtaining the next hit, followed by the second highest ranked, and so on until rank 0, which represents the line with the lowest chances of having a matching block. The expectation is that those lines with a higher LRU count (more recently accessed) will produce more hits than those lines with a lower LRU count. If this trend is satisfied, the average code length to represent hits will decrease, thereby improving compression.

Compression methods 10, 100, and 200 can use computer memory as workspace to implement it as pseudo cache memory with N bits used as input for the current stream value, K bits used as input for the memory address, L bits used to indicate the locations where values are found at the memory address reference, and one bit used as output to indicate whether a hit or a miss results.

Using a fixed length code to represent the line number is advantageous when all line numbers have equal distribution. However, this invariance might not be desirable in practice. If the cache lines could exhibit a non-uniform distribution, the average code length of hits and misses could be reduced further by assigning shorter codes to the lines that are assessed more often. When selecting a compression method for which there is more than one cache line per cache set, the use of one bit markers to represent hits loses significance. The encoding problem needs to be restated in terms of the miss occurrence and the line numbers where such hits occur. Hence, there are, in essence (1+LINES), symbols to encode: "1" code representing a MISS, and "LINES" codes representing the cache lines where each HIT occurs.

One limitation is that encoding lines by their position in the set, i.e. by their line number, offers no gain in terms of code length reduction if they have little correlation, that is, if they exhibit a uniform distribution. This can be overcome if another attribute related to the cache lines is used instead, e.g. using the value of the LRU counter as discussed above with regard to method 200. Another limitation is that more time is involved in encoding and decoding hits and misses. However, this is the general case for any method that considers both coding and modeling. Such time overhead can be reduced by using a static assignment of hits and miss codes in conjunction with the variation previously discussed in order to force a non-uniform distribution of hit codes, and thus, make the most of a variable length encoding scheme to reduce the average code length and improve compression.

Referring generally now to FIGS. 6 and 7, fully associative CMC method 300 is directed to the scenario when K, the number of bits that represents $2^K$ sets, is reduced to its minimum, i.e. zero bits. The result is a full associative cache with only one set in the entire cache. FIG. 7 depicts an exemplar full associative cache arrangement with metrics <N,0,$2^L$>.

One significant effect of the internal caching process implemented by method 300 is that the mapping address is essentially eliminated. As a result, the CMC codec method 300 only needs the current block when searching blocks (step 334), reading blocks (step 330) and writing blocks (steps 340, 342 and 350) in the cache. The set variable is always zero. It should be noted that method 300, unlike methods 100 and 200, does not need to update the variable in the last step of the loop, i.e., after steps 342, 352.

Although the full associative compression method 300 produces more hits than methods 100 and 200, method 300 does not yield a higher compression ratio. This is due to two reasons. First, the number of lines in the set needs to be large enough to accommodate sufficient blocks in order to achieve good hit ratios; and, second, even with a large number of hits, a fixed length coding would not fully take advantage of them since every encoded hit line would have the same length in the compressed stream, eventually taking the same length of an incoming data block, that is, N bits, if exactly $2^N$ cache lines are used per cache set. The latter variation is, however, a valid method, with a more complete example in the description to follow.

In the full associative method 300, a full associative workspace with metrics <N,0,Lines> is used. In this arrangement, only one memory address with multiple locations is used, allowing multiple values to be stored simultaneously in the same memory address. This introduces the additional complexity of encoding the locations where hits occur into the compressed stream so that the decompressor can reconstruct the original data stream. Therefore, the HIT codes are used in this case to represent such locations.

In one further form, the full associative method 300 can be modified to enhance performance by eliminating the need for MISS codes at all by using at least $2^N$ locations per memory address, and initializing each location to specific values 0, 1, 2, . . . , $2^N-2$, $2^N-1$. Therefore, since incoming values are N bits long, there will always be one out of $2^N$ possible values matching some value from the previously initialized locations in the workspace. Again, the HIT codes are used in this case to represent such locations. The specific metric used for the workspace in this case is <N,0,Lines>, where Lines equals 2 to the power of N, i.e. <N,0,Lines>=<N,0,$2^N$>.

Figure 8:
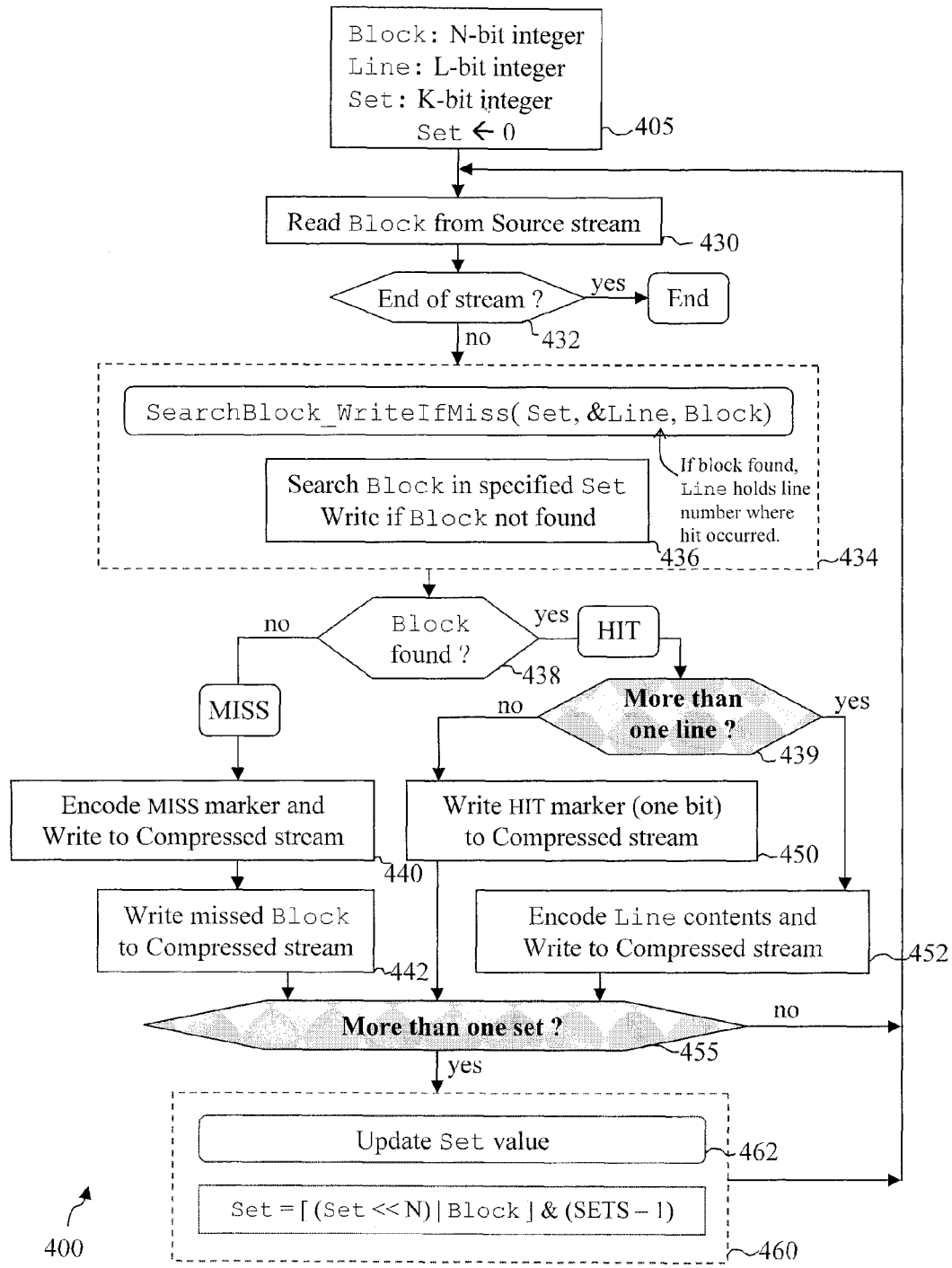
FIG. 8 is a flow chart depicting a generic cache mapping compression method in accordance with the present invention, where the variables Block, Line, and Set refer to the current symbol value, location number (inside a memory address), and the memory address reference, respectively.

Referring now to FIG. 8, generic CMC compression method 400 incorporates methods 100, 200 and 300, which will be readily apparent based on this disclosure. Method 400 includes steps from the prior methods 100, 200 and 300, but raised by 100-300, respectively.

In method 400, data blocks are retrieved from the source stream (step 430), cached if not found (steps 434, 436), hits encoded (steps 450, 452) and misses encoded (steps 440, 442) accordingly. When more lines are added to the set associative scheme (step 439), then hit lines must be encoded as well (step 452). When there is only one set in the associative scheme (step 455), then the set address is not relevant and, therefore, steps 460 and 462 are not performed. The main differences with the specific cache methods are highlighted in gray and bold in FIG. 8.

Another difference between method 400 and methods 10, 100, 200 and 300 is that the hit marker merges with the encoding of the hit lines and the encoding itself is left open for both hits and misses. This unfolds into a myriad of encoding possibilities from which variable length schemes are likely to be the most effective. In contrast, for the set associative and full associative cases, i.e. methods 200 and 300, the encoding is specified explicitly by a fixed length scheme consisting of L bits holding the binary representation of the line.

In method 400, hits and misses are encoded or assigned in the same manner as they are assigned in method 200. For example, hits and misses are encoded in such a way that lower locations, which are most regularly used, are represented by shorter codes, and higher locations, which are used less often, are represented by longer codes. The variable length codes for the HIT codes represent the location in the memory address reference where the current symbol value was found, i.e. the locations where hits occur, in conjunction with an LRU replacement policy, to decide which value should be represented when a mismatch (miss) occurs. Compression method 400 encodes the variable length codes for the hits. Similarly, a reconstruction method decodes such codes. This is applicable only when each memory address has two or more locations, that is, when it can store more than one value simultaneously. Therefore, it is applicable to set-associative configurations with specific metrics <N,K,Lines> where Lines is strictly greater than one.

Computer memory used as workspace is implemented as a pseudo cache memory with N bits used as input for the current symbol value, K bits used as input for the memory address reference, L bits used as output to indicate the locations where values are found at the memory address reference, and one bit used as output to indicate whether a hit or a miss resulted. Pseudo cache memory is used to implement the workspace of compression methods 10, 100, 200, 300 and 400. The term pseudo cache memory is used in this context to reinforce the resemblance between a real architectural cache memory, as used in computer architecture, and the internal workspace used by all compression and reconstruction methods that encompass the cache mapping compression (CMC) family. In particular, the pseudo cache resembles the internal data caching mechanism that occurs between the central processing unit (CPU) of a computer and its main memory, but replacing the CPU for the input stream, and the main memory for the output stream. Consequently, the data locality properties for each cache are exploited differently. The pseudo cache memory exploits the spatial and temporal aspects of such data locality in an attempt to produce compression, whereas the architectural cache attempts to speed up memory access instead. The pseudo cache memory is described in terms of the specific inputs and outputs that the implemented workspace would need to have in order to carry out the compression and reconstruction methods, respectively.

Figure 9:
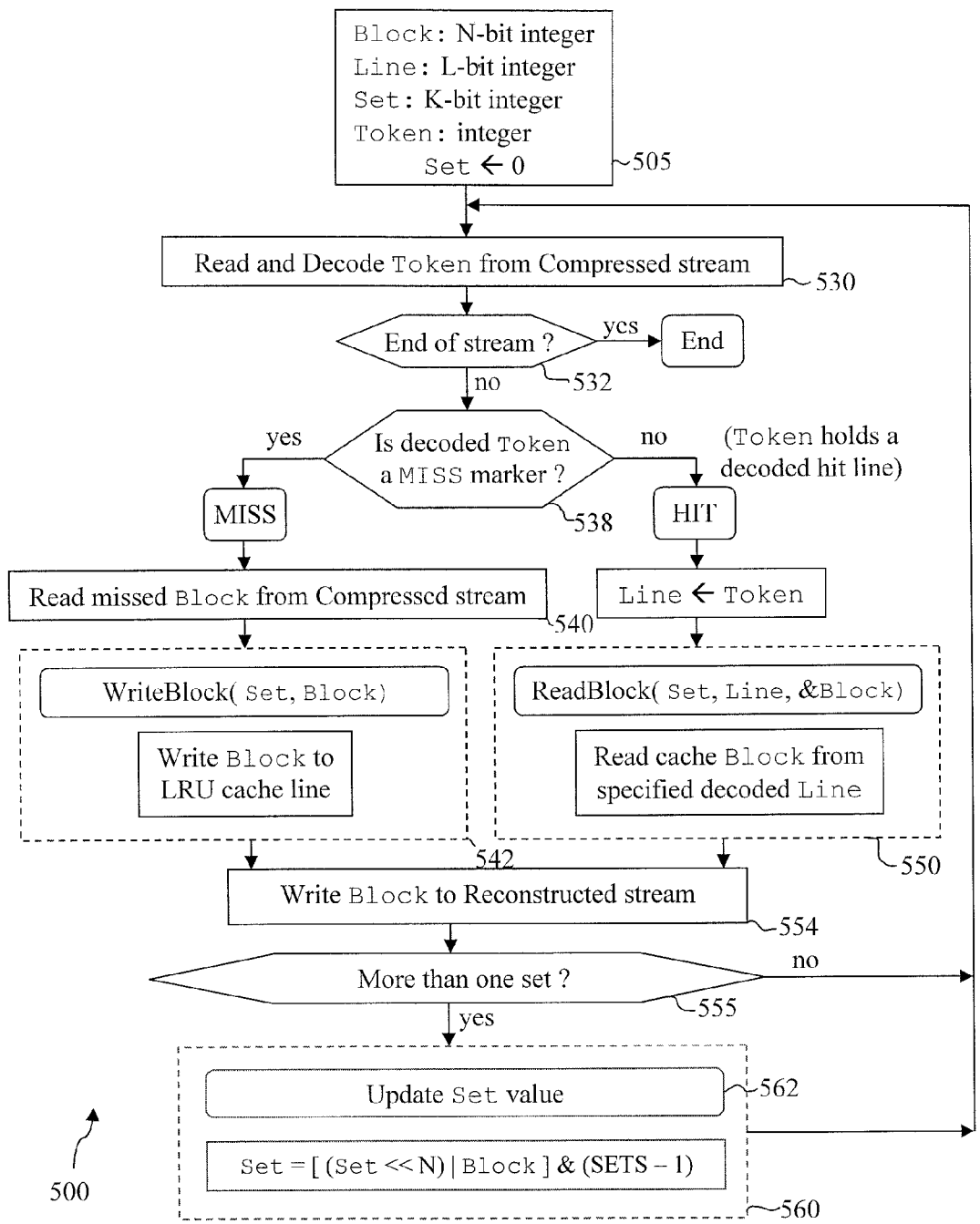
FIG. 9 is a flow chart of a reconstruction method in accordance with the present invention, where the variables Block, Line, and Set refer to the current symbol value, location number (inside a memory address), and the memory address reference, respectively.

Referring to FIG. 9, in general, CMC reconstruction method 500 generates an exact copy of the original source data from a compressed data stream that has been previously generated using the present compression method. Method 500 incorporates similar aspects to those of compression methods 10, 100, 200, 300 and 400, such as the same caching history methodology used during compression, which is replicated during reconstruction method 500.

Referring now specifically to FIG. 9, the various variables, namely Block, Line, Set and Token, are initialized (step 505). During each loop or iteration of method 500, one data block is extracted and written to the reconstructed or uncompressed stream. The block comes from either the compressed stream, if a missed code is decoded, or from the cache, if a hit line is decoded instead. If a miss marker is detected, the block is first read from the compressed stream and cached. Otherwise, the decoded hit line is used as an index to retrieve the block directly from the current set in the cache.

Specifically referring to FIG. 9, local variables for the current block, line, set and token (which holds the temporary hit and miss codes) are declared (step 505). The set is first initialized to zero.

Next, the token is read and decoded where the token must either hold a miss marker or a hit line (step 530). The compressed stream is read completely until the end of the stream (step 532). If a miss marker is detected (step 538), then naturally a miss block follows. Thus, the miss is read next from the source stream (step 540) and written to the current LRU line from cache (step 542). Otherwise, the block is read directly from the cache at the decoded hit line (step 550).

Next, the block obtained from either step 542 or step 550 is written to the reconstructed or uncompressed data stream (step 555). The current set is updated, if applicable (step 560), and method 500 resumes at step 530.

Figure 12:
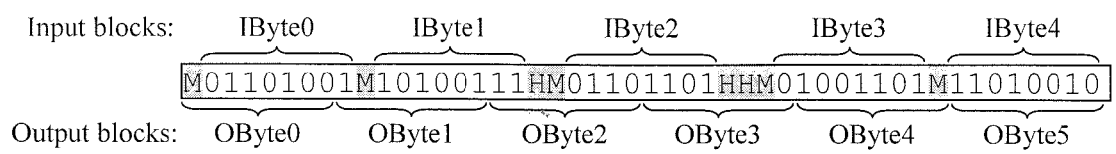
FIG. 12 depicts how the output compressed data is aligned for the particular case where N is 8, including each token, i.e. HIT and MISS codes or control bits used to guide the decompression method in reconstructing the data, in accordance with the present invention.
Figure 12:
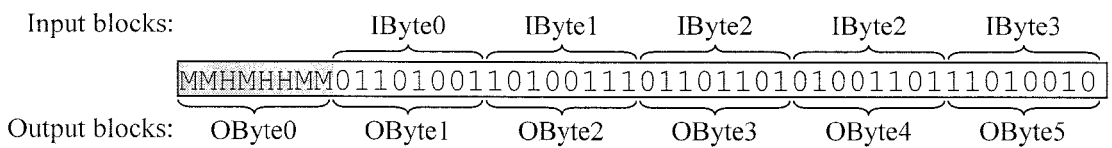

In a further form, HIT and MISS codes/values are grouped into tokens, where these control bits used to guide the decompression method during reconstruction of the data. The tokens that are multiples of N bits, so that values read from the source or compressed stream remain aligned in multiples of N bits when copied to the compressed or uncompressed stream. When N is 8 bits long, i.e. a character byte, the hit and miss codes are grouped into n-byte tokens, where n is a natural number from the set {1, 2, 3, ... }, so that the values read from the source or compressed stream remain byte aligned when copied to the compressed or uncompressed stream, respectively, as shown in the compressed output data of FIG. 12. As a result, an optional optimization is to be performed on the compressed data stream that simplifies input/output operations on individual bits by rearranging, at real time, the way the compressed data is formatted. This combines all HIT and MISS codes together into fixed size tokens. Each token is made a multiple of N, the length in bits of each incoming value read from the source data stream.

Typically, N is made 8 bits long, that is, each incoming value is a character byte, which means that each token is a multiple of a byte, or n-bytes long, where n is a natural number from the set {1, 2, 3, ... }. This optimization has the effect of aligning tokens (hit/miss codes) and source stream values in N-bit boundaries, simplifying input/output operations on both compressed and uncompressed data streams. This improves the overall speed of the present compression and reconstruction methods.

The present compression method can be implemented using alternative mechanisms or schemes. One variant scheme is depicted schematically in FIG. 13 as compression method 600. Method 600 implements a least recently used (LRU) policy to faithfully estimate the occurrence of hits in lines that are continuously referenced. In method 600, a LRU policy is used as a replacement strategy in all CMC codecs to obtain the least recently used line that will be replaced after a miss occurs. This increases the chances of producing hits by not replacing the blocks that were more recently used. The LRU policy implements this functionality by maintaining an internal counter for each line that is referenced. In essence, the value of each line counter represents the current usage rank of its associated line, from 0 (the least recently used) up to LINES −1 (the most recently used). The mechanism is typically implemented using counters because during each update the line counters are simply decremented by 1, except for the line that is currently referenced, which is assigned the highest rank. Therefore, although the LRU policy is only used by the internal cache of the CMC codec to obtain the least recently used line for replacement, the LRU policy actually provides more information than is apparent: it knows the usage rank for "all" lines.

Since the lines that are more recently used have more chance of obtaining future hits than the less recently used, the usage rank of each line can be correlated with the probability of hit occurrence on that line. Hence, under this assumption the line counter with the highest rank will have a higher chance of obtaining the next hit, followed by the second highest ranked, and so on until rank 0, which represents the line with the lowest chances of having a matching block. This leads directly to the formulation of the compression method 600.

Compression method 600 encodes the contents of the LRU counter associated with the lines actually accessed instead of the line number itself. Higher counter values are then assigned shorter codes while the lower values are assigned longer codes. The expectation is that those lines with a high LRU count (more recently accessed) will produce more hits than those lines with a lower LRU count. If this trend is satisfied, method 600 produces good results in practice, and may provide enhanced performance.

Implementation of compression method 600 accesses internal variables related with the LRU policy, which are not accessible via the public interface provided by the Cache ADT. This is, of course, a minor problem which can be easily solved simply by giving the Get_lru_cnt( ) method public scope. This method returns the LRU counter of the specified line.

Figure 13:
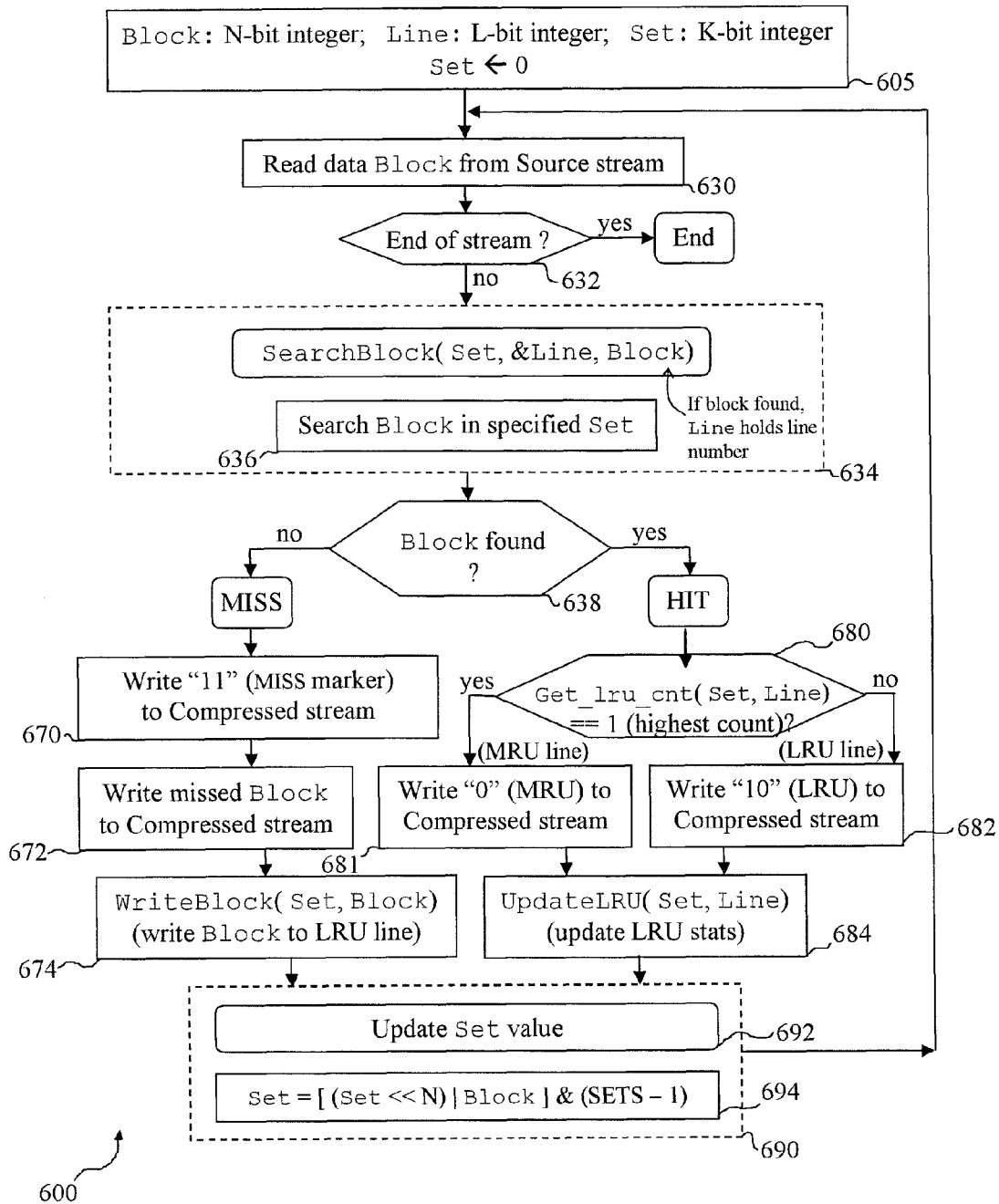
FIG. 13 is a flow chart depicting another CMC compressor method in accordance with the present invention, where the variables Block, Line, and Set refer to the current symbol value, location number (inside a memory address), and the memory address reference, respectively.

Referring now specifically to FIG. 13, one difference with respect to methods 100, 200, and 300 is that method 600 needs to invoke SearchBlock( ) instead of SearchBlockWriteIfMiss( ). The reason for the difference is that while the SearchBlockWriteIfMiss( ) method updates the LRU counters internally according to the line that is referenced, the SearchBlock( ) method does not; it simply searches for the specified block and returns the line number if found. Since the algorithm needs to know the current state of the LRU counters "before" they are updated, SearchBlockWriteIfMiss( ) cannot be used.

Method 600 performs steps 605, 630, and 632, 634 and 636 in a similar manner as the corresponding steps in method 100.

At step 638, once a block is found, method 600 obtains the current state of the LRU counter for the returned line by invoking Get_lru_cnt( ) (step 680), and encodes the hit accordingly—it assigns the shortest code "0" if the line was the most recently used (step 181), or the longest code "10" if it was the least recently used line (step 682). Finally, UpdateLRU( ) is invoked directly to update the status of the LRU counters (step 684), before updating the value for the Set variable as the last step (steps 690, 692, 694).

If a miss occurs instead (step 638), method 600 encodes the miss marker using the remaining 2-bit code "11" (step 670), after which the missed block is written to the compressed stream (step 672). Immediately after, at step 674, the WriteBlock( ) method is invoked directly in order to cache the missed block to the least recently used line. It should be noted that in method 100, 200, and 300, this was not required since the SearchBlockWriteIfMiss( ) method itself performed the caching by invoking WriteBlock( ) internally in case of a miss.

In order to demonstrate that compression method 600 is reversible, it is necessary to revise one of the properties of methods 100, 200, and 300. As noted above, reconstructor 500 replicates the same caching history obtained by the compression method 100, 200, and 400, in the reconstruction process. This means that the same sequence of hits and misses, including the line numbers where they occur, is reproduced verbatim during both compression and reconstruction. This is the same for method 600 as well, since the hit occurrence does not depend on the encoding used, but on the input blocks received from the source stream.

Method 600 is able to reconstruct the original stream using the succession of LRU counts. If the sequence of hits and misses and the referenced line numbers obtained during compression is the same for reconstruction, then the succession of all LRU counter values associated with those lines will also be the same inside the cache. All the reconstructor needs to do is decode the line counter value received from the compressed stream, and search for the cache line whose line counter matches the value just decoded. The returned line number will identify the hit line that was obtained during compression. Finally, the reconstructor caches the block at that line and continues the reconstruction process.

It is believed for some applications, method 600 may perform more operations, on average, than methods 100, 200 and 300 due to the extra step involved in processing the LRU counters. A curious observation, however, is that the reconstructor for method 600 is likely to perform somewhat slower than its related compressor. The reason is because once the LRU count is decoded from the compressed stream, the reconstructor still needs to perform a linear search throughout the LRU counters until a matching count is found. This extra step is not performed in the compressor, and thus it executes faster.

One way to increase the chance of finding the matching LRU count on the first comparison is by using the same reasoning followed in the compressor: assuming that the more recently used lines had a higher chance of being accessed during compression. However, obtaining the LRU count of the most recently used line for that purpose is not done in constant time since it also involves a linear search (in fact, that is how the Get_lru_cnt( ) method is implemented). Thus, it can be concluded that it is not possible to design a faster reconstructor for method 600 using the current LRU implementation. It should be possible, however, to apply the same speed optimization procedure performed on the main instance of the codec to methods 100, 200, and 300 in order to improve the execution speed of these methods.

Method 600 represents an encoding strategy that minimizes the effect of the hit length in the compressed stream. However, while doing so, method 600 also increases the miss code size from one bit to a 2-bit code. If the hit ratio is high enough, as tends to be the case for uncompressed text and other common formats, the burden caused by the 2-bit misses is compensated by the effect of the more common shorter hits that populate the compressed stream. However, if the miss ratio increases due to the presence of random data with little inter-symbol dependence, then method 600 will compress poorly, even worst than the original codec since their expansion factors will be larger. While methods 100, 200, and 300 have an expansion factor of 1+M/N=1+1/8=1.125 or 112.5%, method 600 has an expansion factor of 1+M/N=1+2/8=1.25 or 125%!

In yet an alternative implementation scheme of the present compression method accommodates data with long runs of misses to reduce the expansion. From observing the behavior of method 100 when random data is input to the compressor, the appearance of large runs of misses is the most evident, repetitive occurrence. After analyzing the miss pattern, it is trivial to see that such runs indicating "all misses" can be easily detected by comparing each token with either 0 or −1 (all ones in two's complement notation), depending on how a miss marker is defined. For instance, if the miss marker is 0, as in the speed-optimized codec instance, then a 0 token indicates that 32 consecutive misses follow. If the tokens that signify "all misses" could be controlled somehow, then the size footprint produced by those misses on the compressed stream could be reduced.

Based on the aforementioned observation, the present method can be altered to use an additional 8-bit token (called "big token") to specify the state of the 8 regular tokens that follow. Each bit in the big token controls the output of one regular token. The idea is to suppress the output of all regular tokens that return "all misses" by setting a bit in the big token that indicates so. If a regular token contains at least one hit, the respective bit in the big token is reset instead, and the token is allowed to appear in the compressed stream. The purpose of the big token is then to prevent "all misses" tokens from flooding the compressed stream since they hurt compression ratio.

The following is an exemplary programming code, written in C, for implementing the alternative compression method.

```c
#include <stdio.h>
unsigned char m[0x100000];    /* 1MB cache memory */
#define i ((unsigned char)in)
void main(int argc, char *argv[ ])
{
  unsigned ofs; int in; unsigned char cnt, hits, bt /* big token */;
  if (!argv[1] || *argv[1] != 'c' && *argv[1] != 'd') {
    puts("syntax: compress: cmc3 c stdin stdout\n"
    "        expand:   cmc3 d stdin stdout");
    return;
  }
  /* make stdin/stout binary streams (for windows only).. */
  if (setmode(fileno(stdin), O_BINARY) == -1 ||
      setmode(fileno(stdout), O_BINARY) == -1)
    return;
  /* initialize cache.. */
  for (ofs = 0; ofs < 0x100000; ofs++) m[ofs] = 0;
  if (*argv[1] == 'c') { /* compressor code.. */
    unsigned char o[65]; unsigned op = 0, tp = 0;
    for (ofs = cnt = 0; ; cnt++) {
      /* write incomplete tokens if EOF.. */
    }
    hits = 0;
    /* big token follows every 64th count */
    if (!(cnt & 0x38)) { /* mask=00111000 (64th cnt) */
      *o = bt;
      bt = -1;
      if (fwrite(o, 1, op, stdout) < op)
        break;
      op = 1;
    }
    tp = op++;
  }
  hits <<= 1;
  if (m[ofs] == i) /* if hit.. */
    hits |= 1;
  else       /* if miss.. */
    o[op++] = m[ofs] = i;
  ofs = (ofs << 8 | i) & 0xFFFFF;
  } //for
  } //if
  else { /* expandor code.. */
    int out;
```

-continued

```
if ((in = getchar( )) == EOF) {
  bt <<= 1;
  if (hits)
    o[tp] = hits >> (cnt & 7) | hits << (8 – (cnt & 7));
  else {
    unsigned cnt = --op – tp;
    do {
      o[tp] = o[tp + 1];
      tp++;
    } while (--cnt);
    bt |= 1;
  }
  cnt >>= 3;
  *o = bt >> (cnt & 7) | bt << (8 – (cnt & 7));
  fwrite(o, 1, op, stdout);
  break;
}
/* regular token follows every 8th count, write it.. */
if (!(cnt & 7)) { /* mask=00000111 (each 8th count) */
  bt <<= 1;
  if (hits) /* at least one hit detected, let go.. */
    o[tp] = hits;
  else { /* "all miss" token detected, suppress.. */
    bt |= 1; /*..by shifting the 8 missed bytes left */
    *(long *)(o + tp) = *(long *)(o + tp + 1);
    *(long *)(o + tp + 4) = *(long *)(o + tp + 5);
    --op;
```

```
for (ofs = cnt = 0; ; cnt++) {
  if (!(cnt & 7)) {
    if (!(cnt & 0x38)) {
      if ((in = getchar( )) == EOF)
        break;
      bt = i;
    }
    if (bt & 0x80) /* suppressed token */
      hits = 0;
    else {
      if ((in = getchar( )) == EOF)
        break;
      hits = i;
    }
    bt <<= 1;
  }
  if ((hits & 0x80) == 0) {
    if ((in = getchar( )) == EOF)
      break;
    m[ofs] = i;
  }
  hits <<= 1;
  if ((out = putchar( m[ofs])) == EOF)
    break;
  ofs = (ofs << 8 | (char)out) & 0xFFFFF;
} //for
} //else
} //main
```

The above program uses standard streams because the output is byte aligned. The only bit oriented operations occur on the variables "hit" and "bt", which hold the current values for the "regular token" and the "big token", respectively.

The following is an illustrative example to provide a further explanation of the use of expansion control in the present data compression method. As noted above, the present expansion control creates an additional word, (i.e. a big-token), that controls inclusion or suppression of regular tokens. If the big-token is assigned B bits, it will control B regular tokens, one bit per token. The goal is to reduce expansion by suppressing tokens that contain all misses, which will be marked in the big-token accordingly.

The following is the previous compressed output without expansion control:

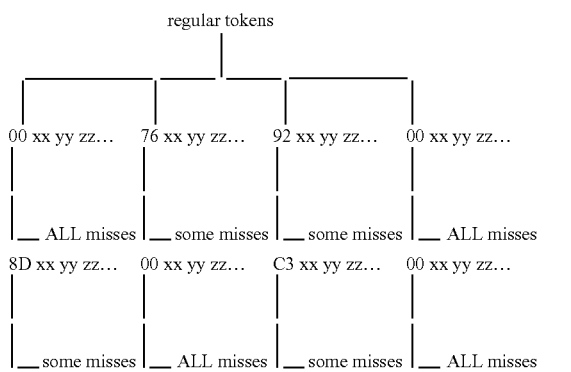

The following is the same output with expansion control:

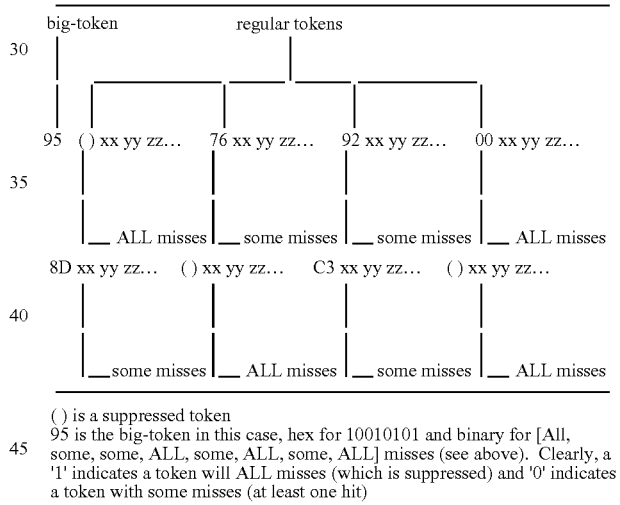

( ) is a suppressed token
95 is the big-token in this case, hex for 10010101 and binary for [All, some, some, ALL, some, ALL, some, ALL] misses (see above). Clearly, a '1' indicates a token will ALL misses (which is suppressed) and '0' indicates a token with some misses (at least one hit)

The alternative method was tested on the "random.txt" file from the Artificial Corpus and the results compared with the performance achieved by the methods 100, 200 300 and 600.

Since the "random.txt" file, as its name implies, contains random data, the methods 100, 200, and 300 approached the estimated expansion factor of 112.5% (c.ratio=−12.5%), while method 600 approached its predicted expansion factor of 125% (c.ratio=−25%). The actual asymptotic values were not reached because some hits were produced. This alternative method reduces the expansion factor by more than 10% with respect to the method 100, 200 and 300 from 111.74% to 101.54%. In addition, this alternative method has a higher hit ratio (0.0114) than the method 100, 200, and 300 (0.0076) their expansion factors are larger since they use a 2-bit miss marker, instead of one bit as methods 100, 200 and 300.

It will now be clear that the present compression method offers features and advantages not found in prior compression methods. The present CMC codec is universal, processing data blocks received from an input stream in much the same way for every source and regardless of the characteristics of the input data.

A further feature of the present method is that it is symmetric. This means that both the CMC compression method and reconstruction method perform essentially the same process in terms of relative effort, time and space complexity, etc. Such a symmetric behavior is made more evident when analyzing the time/space complexity of the CMC codec.

In addition, the present CMC codec works in "exclusive stream" mode. In short, this means that every symbol received from the input stream is processed "one at a time" and, more importantly, that an output will be produced immediately after processing such symbol. This differs from most of the previous compression methods since, in general, they work in either regular stream mode or block mode. In regular stream mode, symbols are processed one at a time, but their output is not produced immediately after; it is rather delayed until a given number of input symbols build up internally so that they can be processed. In block mode, the compressor reads a fixed number of symbols, usually a few kilobytes, from the source data stream, processes them, and produces an equivalent compressed block.

Some advantages are derived from the "exclusive stream" mode implemented by the present method. For instance, in digital communications it might be required for a given communication process to keep an intermittent flow of data from transmitter to receiver. If the data is not sent from the transmitter at regular intervals, the receiver might lose data synchronization (sync) with the transmitter. If the communication process relies on a compression technology that works in either regular stream mode or block mode, then the receiver might lose data sync during intervals when the transmitter is idle, while the compressor is building up and processing input symbols internally. In contrast, if the present methods associated with the CMC technology are used instead, there is no possibility of data sync loss since the methods will immediately produce an equivalent output for every input symbol received. This is only one example that highlights the benefits of exclusive stream mode versus regular stream or block mode, for the particular domain of digital communications.

Similar advantages from exclusive stream mode can be obtained in other domains where a real-time response is required. For instance, consider a simple chat application whereby a user inputs a character, the character is transmitted over the internet (or some other channel) and finally received by the recipient who expects to see the character on the chat window. In either stream or block mode, such character might not display at all until the compressor (on the transmitter end) does release the character, since a few characters must be first received in order for the compressor to start processing them. In contrast, the exclusive stream mode of the CMC compressor guarantees that the compressed character will be released by the compressor immediately and sent over the channel, after which the decompressor will reconstruct the original character and release it to the chat application for displaying.

The symmetric behavior of the CMC codec also has an inherent practical advantage, which is the "sharing" of most internal resources used by the codec. This is because the same method is performed, but in opposite directions. Therefore, one operation mode can use the shared resources while the other is idle. This minimizes both operation and design costs.

One aspect of the full associative CMC scheme is that by forcing some cache metrics to meet a certain condition, the miss probability can be made literally 0%. That is, there will always be a block in the cache that matches the current block read from the source stream. Therefore, if hits are always produced, it would not be necessary to mark hits or misses at all, and the compressed output would just consist of encoded hit lines. If coupled with an LRU scheme, and if shorter codes are assigned to the most recently used lines, and finally encoded in the output stream, then the resulting method degenerates into a coding technique called Move-To-Front.

The Move-To-Front method can be considered a variant of the full associative CMC codec and can be implemented easily using the existing workspace infrastructure, which can be modeled through cache abstract data type (ADT). To illustrate this process, assume that a full associative cache is created with metrics <N, 0, $2^N$. That is, LINES (the number of cache lines) equals $2^N$, the number of all possible distinct data blocks (for instance, if N=8, there will be 256 lines in the set). If all cache lines are initialized to hold a distinct data block, so that in lines 0 to $2^N$ there is a block in each with values 0 to $2^N$, respectively, then whenever a block is read from the source stream, hits will always be produced because there will always be a matching block at some line in the cache.

Figure 10:
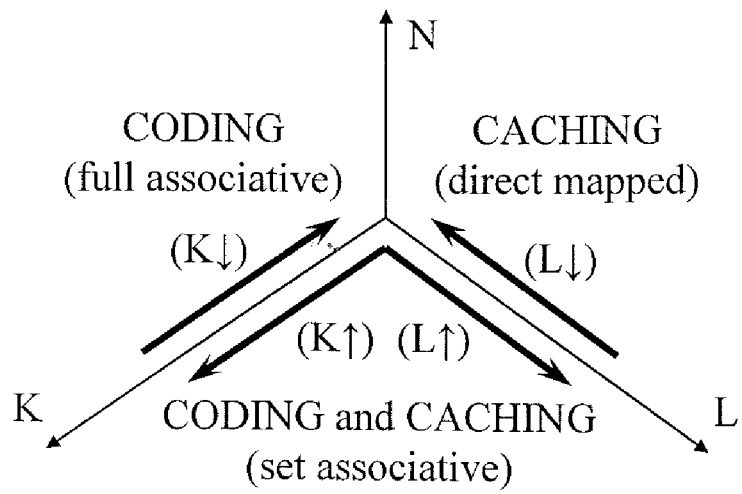
FIG. 10 is a comparative diagram depicting the relationship between coding and caching processes with respect to the direct-mapped, full-associative, and set-associative methods, in accordance with the present invention.

From an operational standpoint, the CMC codec "shifts" functionality according to the border conditions of the cache metrics. FIG. 10 is a diagram showing this aspect of the present method. As the number of cache lines decrease, the compressor essentially performs just caching without encoding involved—data blocks are mapped into a direct-mapped cache, where no line numbers are encoded. Likewise, as the number of sets is reduced to one, the present compression method becomes a full encoder—the caching process loses significance since it is more important to produce optimal codes than to produce cache hits. The turning point occurs when both the number of sets and lines increase, where caching and coding both become crucial in the compression process, and share relative relevance to produce high compression ratios.

Compression methods 10, 100, 200, 300, 400 and reconstruction method 500 can be realized as a finite state automaton and implemented as a software or hardware artifact, including size/speed optimizations that exploit the inherent parallelism of the method by using associative or intelligent memory schemes whereby multiple locations from a given memory address are compared in parallel, i.e. simultaneously or concurrently. In other words, the implementation of any of the present compression and reconstruction methods as a finite state automaton can be realized as a virtual machine consisting of a finite number of states, each state representing one step of the compression and reconstruction process, respectively. This is applicable to all compression and reconstruction methods proposed in this disclosure. This also includes the particular case wherein all values stored concurrently in the many locations of a memory address are compared in parallel with the current symbol value using special hardware circuitry, thus implementing the behavior of an associative or intelligent memory with content-addressable data words, where each data word represents a symbol value previously stored from the input stream. Such parallelized optimized versions are only possible with set-associative workspace configurations with specific metrics <N,K, Lines>, where Lines is greater than one.

This process can be performed by special hardware circuitry that compares each bit from every location in the memory address reference to each bit from the current symbol value simultaneously, yielding the matching location in at most N comparisons, where N is the size in bits of the current symbol value. If associative memory is not used, then the value at each location needs to be compared individually with the current symbol value, resulting in "Lines" times "N" comparisons, where Lines is the total number of locations for each memory address.

Although the invention has been described in considerable detail with respect to preferred embodiments, it will be apparent that the invention is capable of numerous modifications and variations, apparent to those skilled in the art, without departing from the spirit and scope of the claims.

The invention claimed is:

1. A computer implemented method for compressing electronic data from a source stream of data comprising a string of values, using one or more distinct computer memory addresses as workspace, each computer memory address having one or more locations to hold one or more distinct values respectively, said computer implemented method comprising:
   (a) reading K bits from the electronic source data stream, which are immediately prior to a current reading point in the source stream, as a memory address reference, if K is greater than zero;
   (b) reading N bits from the source stream as a current symbol value;
   (c) writing the current symbol value to replace one of the values at the memory address reference of the computer memory if the current symbol value does not match any of the values at the memory address reference, and writing a MISS code/value followed by the current symbol value to a compressed electronic data stream; and
   (d) writing a HIT code, representing the location in the computer memory at the memory address reference where the value was found, to the compressed data stream if the current symbol value matches any of the values in the computer memory at the memory address reference.

2. The computer implemented method of claim 1, wherein the K bits are converted into fewer number of bits by a hash function that takes a current value of the memory address reference, shifts it to the left by an amount lesser than N bits, performs an XOR operation with the current N-bit symbol value, the most significant bits of the result are reset to fit the size of the cache workspace, and the resulting word is used as the next memory address reference.

3. The computer implemented method of claim 2, wherein shifts it left by N-H bits so that H bits overlap with the current symbol.

4. The computer implemented method of claim 1, wherein big-token words B bits long are inserted in the compressed stream, each signaling a state of B regular tokens that follow; every bit in the big-token controlling one regular token, wherein a bit is assigned 0 if its respective token has at least one hit in it, or a 1 is recorded and the token itself is suppressed from the compressed stream.

5. A computer implemented method for compressing electronic data from a source stream of data comprising a string of values, using one or more distinct computer memory addresses as workspace, each computer memory address having one or more locations to hold one or more distinct values respectively, said computer implemented method comprising:
   (a) reading K bits from the electronic source data stream, which are immediately prior to a current reading point in the source stream, as a memory address reference, if K is greater than zero;
   (b) reading N bits from the source stream as a current symbol value;
   (c) writing the current symbol value to replace one of the values at the memory address reference of the computer memory if the current symbol value does not match any of the values at the memory address reference, and writing a MISS code/value followed by the current symbol value to a compressed electronic data stream; and
   (d) writing a HIT code to the compressed data stream, in which the HIT code represents a least recently used (LRU) counter value associated with the location in the computer memory at the memory address reference where the value was found, the HIT code being assigned a shorter code if the LRU counter of said location has a higher value or a longer code if said location has a lower value,
   wherein LRU counters are associated with each location in the memory address, and said LRU counters represent a usage rank for each location so that higher LRU counter values represent more recently used locations and lower LRU counter values represent least recently used locations.

6. The computer implemented method of claim 5, wherein respective LRU counters are kept in a respective status field.

7. The method of claim 5, wherein the HIT/MISS code values are adaptively assigned throughout said method, wherein said HIT/MISS codes vary during said method based on respective symbol values which comprise the data stream.

8. The method of claim 7, wherein the HIT/MISS codes are assigned adaptively by initially assigning one bit to a MISS code and L+1 bits to the HIT codes representing the locations of the matched values inside the current memory address, wherein any consecutive repeating code, HIT or MISS, longer than one bit will swap bit encodings with the current one-bit code, and thus establish new encodings; and the new encodings will be in effect until a different consecutive repeating code longer than one bit is detected, wherein a new bit encoding will be assigned, accordingly.

9. A computer implemented method for reconstructing an uncompressed source data stream from compressed data comprising at least some of the source data along with compression codes comprising MISS and HIT codes, using one or more distinct computer memory addresses as workspace, each computer memory address having one or more locations to hold one or more distinct values respectively, said computer implemented method comprising:
   (a) reading K bits from the uncompressed data stream, which are immediately prior to the current insertion point in the uncompressed stream, as a memory address reference, if K is greater than zero;
   (b) reading a code value from the compressed data stream, said code value representing either a HIT encoded location or a MISS occurrence;
   (c) if the value is a MISS code, reading N bits from the compressed stream as the current symbol value, writing the current symbol value to replace one of the values in the computer memory at the memory address reference obtained in (a), and writing the current symbol value to the uncompressed stream; and
   (d) if the value is a HIT code, reading N bits from the location given by the decoded HIT code in the computer memory at the memory address reference obtained in (a) as the current symbol value, and writing the current symbol value to the uncompressed stream.

10. The computer implemented method of claim 9, wherein the K bits are converted into fewer number of bits by a hash function that takes the current value of the memory address reference, shifts it to the left by an amount lesser than N bits, performs an XOR operation with the current N-bit symbol value, the most significant bits of the result are reset to fit the size of the cache workspace, and the resulting word is used as the next memory address reference.

11. The computer implemented method of claim 10, wherein shifts it left by N-H bits so that H bits overlap with the current symbol.

12. The computer implemented method of claim 11, wherein the computer memory used as workspace is implemented as a pseudo cache memory with N bits used as input for the current symbol value, K bits used as input for the memory address reference, L bits used as input to indicate the location at the memory address reference where the current symbol value needs to be read from, and N bits to output such current symbol value.

13. The computer implemented method of claim 10, wherein big-token word B bits long are decoded from the compressed stream, each signaling a state of B regular tokens that follow; every bit in the big-token controls one regular token, wherein if a bit is 0 its respective token is read from the compressed stream and decoded normally, or the token is assigned all misses.

14. The computer implemented method of claim 10, wherein each decoded HIT code does not represent a location itself, but a least recently used (LRU) counter value associated with the location that resulted in a hit for the given memory address; and said method further comprising:
  (a) searching for the location associated with the LRU counter value;
  (b) reading from such location, obtained in (a), the current symbol value;
wherein the LRU counters are kept in the status field and are used to implement an LRU replacement policy and represent a usage rank for each location.

15. The method of claim 14, wherein the HIT/MISS code values are adaptively determined throughout a decompression process according to local characteristics of the original source data stream previously compressed.

16. The method of claim 15, wherein the HIT/MISS codes are assigned adaptively by initially assigning one bit to a MISS code and L+1 bits to the HIT codes representing the locations of the matched values inside the current memory address, wherein any consecutive repeating code, HIT or MISS, longer than one bit will swap bit encodings with the current one-bit code, HIT or MISS, and thus establish new encodings; and the new encodings will be in effect until a different consecutive repeating code longer than one bit is detected, wherein a new bit encoding will be assigned, accordingly.

17. A system for compressing electronic data from a source stream of data comprising a string of values, using one or more distinct computer memory addresses as workspace, each computer memory address having one or more locations to hold one or more distinct values respectively, said system comprising:
  computer memory having one or more distinct computer memory addresses, each computer memory address having one or more locations to hold one or more distinct values, respectively; and
  a processor for:
    (a) reading K bits from an electronic source data stream, which are immediately prior to a current reading point in the source stream, as a memory address reference in the computer memory, if K is greater than zero;
    (b) reading N bits from the source stream as a current symbol value;
    (c) writing the current symbol value to replace one of the values at the memory address reference of the computer memory if the current symbol value does not match any of the values at the memory address reference, and writing a MISS code/value followed by the current symbol value to a compressed electronic data stream; and
    (d) writing a HIT code, representing the location in the computer memory at the memory address reference where the value was found, to the compressed data stream if the current symbol value matches any of the values in the computer memory at the memory address reference.

18. The system of claim 17, wherein HIT/MISS codes are adaptively assigned during data compression based on the respective symbol values which comprise the data stream.

19. The system of claim 18, wherein the HIT/MISS codes are assigned adaptively by initially assigning one bit to a MISS code and L+1 bits to the HIT codes representing the locations of the matched values inside the current memory address, wherein any consecutive repeating code, HIT or MISS, longer than one bit will swap bit encodings with the current one-bit code, HIT or MISS, and thus establish new encodings; and the new encodings will be in effect until a different consecutive repeating code longer than one bit is detected, wherein a new bit encoding will be assigned, accordingly.

20. The system of claim 17, wherein the K bits are converted into fewer number of bits by a hash function that takes a current value of the memory address reference, shifts it to the left by an amount lesser than N bits, performs an XOR operation with the current N-bit symbol value, the most significant bits of the result are reset to fit the size of the cache workspace, and the resulting word is used as the next memory address reference.

21. The system of claim 20, wherein shifts it left by N-H bits so that H bits overlap with the current symbol.

22. The system of claim 20, wherein big-token words B bits long are inserted in the compressed stream, each signaling a state of B regular tokens that follow; every bit in the big-token controlling one regular token, wherein a bit is assigned 0 if its respective token has at least one hit in it, or a 1 is recorded and the token itself is suppressed from the compressed stream.

23. A system for compressing electronic data from a source stream of data comprising a string of values, using one or more distinct computer memory addresses as workspace, each computer memory address having one or more locations to hold one or more distinct values respectively, said system comprising:
  computer memory having one or more distinct computer memory addresses, each computer memory address having one or more locations to hold one or more distinct values, respectively; and
  a processor for:
    (a) reading K bits from the electronic source data stream, which are immediately prior to a current reading point in the source stream, as a memory address reference, if K is greater than zero;
    (b) reading N bits from the source stream as a current symbol value;
    (c) writing the current symbol value to replace one of the values at the memory address reference of the computer memory if the current symbol value does not match any of the values at the memory address reference, and writing a MISS code/value followed by the current symbol value to a compressed electronic data stream; and
    (d) writing a HIT code to the compressed data stream, in which the HIT code represents a least recently used (LRU) counter value associated with the location in the computer memory at the memory address reference where the value was found, the HIT code being assigned a shorter code if the LRU counter of said location has a higher value or a longer code if said location has a lower value, wherein LRU counters are associated with each location in the memory address, and said LRU counters represent a usage rank for each location so that higher LRU counter values represent more recently used locations and lower LRU counter values represent least recently used locations.

24. A system for reconstructing an uncompressed electronic source data stream from compressed electronic data comprising at least some of the source data along with compression codes comprising MISS and HIT codes, said system comprising:

computer memory having one or more distinct computer memory addresses, each computer memory address having one or more locations to hold one or more distinct values, respectively; and a processor for:
(a) reading K bits from the uncompressed data stream, which are immediately prior to the current insertion point in the uncompressed electronic stream, as a memory address reference of the computer memory, if K is greater than zero;
(b) reading a code value from the compressed electronic data stream, said code value representing either a HIT encoded location or a MISS occurrence;
(c) if the value is a MISS code, reading N bits from the compressed stream as the current symbol value, writing the current symbol value to replace one of the values in the computer memory at the memory address reference obtained in (a), and writing the current symbol value to the uncompressed stream; and
(d) if the value is a HIT code, reading N bits from the location given by the decoded HIT code in the computer memory at the memory address reference obtained in (a) as the current symbol value, and writing the current symbol value to the uncompressed stream.

25. The system of claim 24, wherein every memory address used as workspace has only one location that holds one value only; and wherein at (d), the HIT code indicates that the current symbol value matches the one found at the memory address reference.

26. The system of claim 24, wherein one single memory address, having many locations each holding one distinct value, is used as workspace; and hence at (a), no bits are read from the compressed stream since K is zero, whereby there is only one memory address, and the memory address reference is zero.

27. The system of claim 24, wherein the single memory address has $2^N$ locations previously initialized with distinct values; and at (c), no MISS code or current symbol value is ever read or appears in the compressed data stream since any current symbol value can always be found at some previously initialized location.

28. The system of claim 24, wherein the computer memory used as workspace is implemented as a pseudo cache memory with N bits used as input for the current symbol value, K bits used as input for the memory address reference, L bits used as input to indicate the location at the memory address reference where the current symbol value needs to be read from, and N bits to output such current symbol value.

29. The system of claim 24, wherein HIT/MISS codes are adaptively assigned during data compression based on the respective symbol values which comprise the data stream.

30. The system of claim 29, wherein the HIT/MISS codes are assigned adaptively by initially assigning one bit to a MISS code and L+1 bits to the HIT codes representing the locations of the matched values inside the current memory address, wherein any consecutive repeating code, HIT or MISS, longer than one bit will swap bit encodings with the current one-bit code, HIT or MISS, and thus establish new encodings; and the new encodings will be in effect until a different consecutive repeating code longer than one bit is detected, in which case a new bit encoding will be assigned, accordingly.

* * * * *